(12) United States Patent
Woo et al.

(10) Patent No.: US 11,943,956 B2
(45) Date of Patent: Mar. 26, 2024

(54) DISPLAY APPARATUS INCLUDING MULTI-LAYERED OPTICAL FUNCTION LAYER

(71) Applicant: SAMSUNG DISPLAY CO., LTD., Yongin-si (KR)

(72) Inventors: Minwoo Woo, Yongin-si (KR); Gunwoo Ko, Yongin-si (KR); Wangwoo Lee, Yongin-si (KR); Junghyun Cho, Yongin-si (KR); Kangwook Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 258 days.

(21) Appl. No.: 17/337,108

(22) Filed: Jun. 2, 2021

(65) Prior Publication Data

US 2021/0399262 A1    Dec. 23, 2021

(30) Foreign Application Priority Data

Jun. 22, 2020    (KR) .......................... 10-2020-0075936

(51) Int. Cl.
*H10K 50/84* (2023.01)
*G06F 3/041* (2006.01)
(Continued)

(52) U.S. Cl.
CPC ......... *H10K 50/844* (2023.02); *G06F 3/0412* (2013.01); *H10K 50/86* (2023.02);
(Continued)

(58) Field of Classification Search
CPC .... H10K 50/844; H10K 50/86; H10K 50/858; H10K 50/84; H10K 50/85; H10K 50/115;
(Continued)

(56) References Cited

U.S. PATENT DOCUMENTS

| 2007/0157839 | A1 | 7/2007 | Kim et al. |
| 2018/0095584 | A1* | 4/2018 | Lee ........................ G06F 3/0446 |

(Continued)

FOREIGN PATENT DOCUMENTS

| EP | 3441858 A1 * | 2/2019 | ........... G06F 3/0412 |
| EP | 3553637 A1 * | 10/2019 | ........... G06F 3/0412 |

(Continued)

OTHER PUBLICATIONS

Lee et al.; Investigation of the lotus leaf effect using the scanning probe microscopes; Journal of the Korea Academia-Industrial cooperation Society; vol. 16, No. 9 pp. 5756-5762, 2015.

(Continued)

*Primary Examiner* — Ida M Soward
(74) *Attorney, Agent, or Firm* — Lewis Roca Rothgerber Christie LLP

(57) ABSTRACT

Provided is a display apparatus having improved reliability by effectively controlling spreading of an organic layer. The display apparatus includes a substrate including a display area, and a peripheral area outside the display area, a display element at the display area, an input-sensing layer over the display element, and an optical functional layer on the input-sensing layer, and including a first layer, which corresponds to the display area and the peripheral area, and a second layer on the first layer, and having a greater refractive index than the first layer, wherein the first layer defines a first valley portion defining first holes that is on the peripheral area, and that surrounds the second layer.

30 Claims, 27 Drawing Sheets

(51) Int. Cl.
| | |
|---|---|
| *H10K 50/844* | (2023.01) |
| *H10K 50/86* | (2023.01) |
| *H10K 59/12* | (2023.01) |
| *H10K 59/122* | (2023.01) |
| *H10K 59/40* | (2023.01) |
| *G02F 1/1333* | (2006.01) |
| *G02F 1/1335* | (2006.01) |
| *G06F 1/16* | (2006.01) |
| *G09F 9/30* | (2006.01) |
| *H10K 50/115* | (2023.01) |
| *H10K 50/15* | (2023.01) |
| *H10K 50/16* | (2023.01) |
| *H10K 50/17* | (2023.01) |
| *H10K 50/80* | (2023.01) |
| *H10K 50/842* | (2023.01) |
| *H10K 59/121* | (2023.01) |
| *H10K 77/10* | (2023.01) |
| *H10K 102/00* | (2023.01) |

(52) U.S. Cl.
CPC .......... *H10K 59/122* (2023.02); *H10K 59/40* (2023.02); *G02F 1/133331* (2021.01); *G02F 1/133514* (2013.01); *G06F 1/1641* (2013.01); *G06F 1/1652* (2013.01); *G09F 9/301* (2013.01); *G09G 2300/0408* (2013.01); *G09G 2380/02* (2013.01); *H10K 50/115* (2023.02); *H10K 50/15* (2023.02); *H10K 50/16* (2023.02); *H10K 50/17* (2023.02); *H10K 50/171* (2023.02); *H10K 50/8426* (2023.02); *H10K 50/868* (2023.02); *H10K 59/12* (2023.02); *H10K 59/1216* (2023.02); *H10K 77/111* (2023.02); *H10K 2102/311* (2023.02)

(58) Field of Classification Search
CPC .. H10K 50/8426; H10K 50/868; H10K 50/17; H10K 50/171; H10K 50/15; H10K 50/16; H10K 59/122; H10K 59/40; H10K 59/131; H10K 59/12; H10K 59/1216; H10K 77/111; G02F 1/133331; G02F 1/133514; G02F 9/301; G06F 1/1641; G06F 1/1652; G06F 3/0412; G09G 3/3208; G09G 2300/0408; G09G 2380/02
See application file for complete search history.

(56) References Cited

U.S. PATENT DOCUMENTS

| | | | |
|---|---|---|---|
| 2018/0181240 A1* | 6/2018 | Heo | G06F 3/0412 |
| 2018/0188432 A1* | 7/2018 | Choi | H10K 50/86 |
| 2018/0358413 A1* | 12/2018 | Lee | G06F 3/04164 |
| 2019/0036063 A1* | 1/2019 | Lee | G06F 3/0412 |
| 2019/0051711 A1* | 2/2019 | Lee | G09G 3/3208 |
| 2019/0123113 A1* | 4/2019 | Kim | G06F 3/0443 |
| 2019/0131379 A1* | 5/2019 | Won | H10K 59/131 |
| 2019/0165061 A1* | 5/2019 | Jung | H10K 50/844 |
| 2019/0319076 A1* | 10/2019 | Lee | G06F 3/0446 |
| 2019/0355935 A1* | 11/2019 | Jung | H10K 59/353 |
| 2019/0371865 A1* | 12/2019 | Lee | H10K 59/122 |
| 2020/0125203 A1* | 4/2020 | Kim | G06F 3/0446 |
| 2020/0135812 A1* | 4/2020 | Ohara | H10K 50/8445 |
| 2020/0161398 A1* | 5/2020 | Bang | H10K 59/122 |
| 2020/0210006 A1* | 7/2020 | Son | H10K 59/12 |
| 2020/0321402 A1* | 10/2020 | Jeon | H10K 59/40 |
| 2021/0005845 A1 | 1/2021 | Kim et al. | |
| 2021/0066667 A1 | 3/2021 | Yun et al. | |
| 2021/0083013 A1* | 3/2021 | Bang | H10K 59/131 |

FOREIGN PATENT DOCUMENTS

| | | | | |
|---|---|---|---|---|
| KR | 10-0790866 B1 | 1/2008 | | |
| KR | 10-2008-0029279 A | 4/2008 | | |
| KR | 10-2019-0065757 A | 6/2019 | | |
| KR | 20190119697 A | * 10/2019 | ........... | G06F 3/0412 |
| KR | 20190119698 A | * 10/2019 | ........... | G06F 3/0446 |

OTHER PUBLICATIONS

Rupp et al.; A review on the wettability of dental implant surfaces: Theoretical and experimental aspects; Elsevier Acta Biomaterialia; 2014, pp. 1-13.

* cited by examiner

DISPLAY APPARATUS INCLUDING MULTI-LAYERED OPTICAL FUNCTION LAYER

CROSS-REFERENCE TO RELATED APPLICATION

This application claims priority to, and the benefit of, Korean Patent Application No. 10-2020-0075936, filed on Jun. 22, 2020, in the Korean Intellectual Property Office, the disclosure of which is incorporated by reference herein in its entirety.

BACKGROUND

1. Field

One or more embodiments relate to a display apparatus having improved reliability due to effective control of spreading of an organic layer.

2. Description of the Related Art

Organic light-emitting display apparatuses have larger viewing angles, better contrast characteristics, and faster response speeds than other display apparatuses, and thus have drawn attention as next-generation display apparatuses.

In general, organic light-emitting display apparatuses include a thin-film transistor and an organic light-emitting diode, which is a display element, formed on a substrate, and the organic light-emitting diode emits light by itself (e.g., is self-emissive). Such organic light-emitting display apparatuses may be used as displays of small products, such as mobile phones, and may also be used as displays of large products, such as televisions.

SUMMARY

Conventional display apparatuses include an organic layer, and the organic layer may be formed using, for example, an inkjet method. During this process, the organic layer may overflow to outside of a region on which the organic layer is supposed to be formed.

One or more embodiments of the present disclosure include a display apparatus having an improved reliability due to effective control of spreading of an organic layer. However, the disclosed embodiments are only examples, and the scope of the disclosure is not limited thereto.

Additional aspects will be set forth in part in the description which follows and, in part, will be apparent from the description, or may be learned by practice of the disclosed embodiments.

According to one or more embodiments, a display apparatus includes a substrate including a display area, and a peripheral area outside the display area, a display element at the display area, an input-sensing layer over the display element, and an optical functional layer on the input-sensing layer, and including a first layer, which corresponds to the display area and the peripheral area, and a second layer on the first layer, and having a greater refractive index than the first layer, wherein the first layer defines a first valley portion defining first holes that is on the peripheral area, and that surrounds the second layer.

The first holes may be aligned in at least one row in a first direction, and in at least one column in a second direction that crosses the first direction.

The first holes may include first sub-holes arranged in the first direction, second sub-holes spaced from the first sub-holes, and arranged in the first direction, and third sub-holes spaced from the second sub-holes, and arranged in the first direction.

The first sub-holes may be spaced from each other at intervals of a first distance, wherein the second sub-holes are centered between respective adjacent ones of the first sub-holes with respect to the first direction.

At least one of the first holes may have a diamond shape.

At least one vertex of the first holes may face an end of the second layer.

A first width between two parallel sides of one of the first holes may be about 1 μm to about 10 μm.

A second width between two opposite vertexes of one of the first holes may be about 1 μm to about 15 μm.

An adjacent pair of the first holes may be spaced from each other in a first direction at intervals of a first distance of about 1 μm to about 15 μm.

The first width may be less than the first distance.

The first valley portion may further include an auxiliary valley extending in a first direction, the first holes being between the auxiliary valley and an end of the second layer.

A first end of the auxiliary valley that is adjacent to the first holes may be curved in correspondence with a shape and arrangement of the first holes.

A second end of the auxiliary valley that is opposite to the first end may include a straight shape.

The first layer may further define a second valley portion that surrounds the second layer in correspondence with the peripheral area, and that is spaced from the first valley portion.

The second valley portion may define second holes.

The second valley portion may extend in a first direction.

A width of the second valley portion in a second direction that crosses the first direction may be less than or equal to a width of the first valley portion.

The display apparatus may further include a thin-film encapsulation layer that is between the display element and the input-sensing layer, and that includes at least one organic encapsulation layer and at least one inorganic encapsulation layer, wherein the input-sensing layer is directly on the thin-film encapsulation layer.

The display apparatus may further include a partition wall surrounding the display area in correspondence with the peripheral area, wherein the first valley portion surrounds the partition wall.

The second layer may cover the partition wall.

The at least one inorganic encapsulation layer may extend below the first layer in the peripheral area, wherein the first holes expose at least a portion of the at least one inorganic encapsulation layer.

The first layer may further define an opening pattern corresponding to the display element.

A width of at least one of the first holes may be less than or equal to a width of the opening pattern.

The display element may include a pixel electrode, an opposite electrode opposite the pixel electrode, and an intermediate layer between the pixel electrode and the opposite electrode, wherein the display apparatus further includes a pixel-defining layer covering an edge of the pixel electrode, and having an opening that exposes a center portion of the pixel electrode, and wherein a width of the opening pattern is less than a width of the opening.

The intermediate layer may include a green emission layer, wherein the opening pattern has the same size as a corresponding one of the first holes.

The second layer may have a greater refractive index than the first layer.

The second layer may have a refractive index of about 1.6 or greater.

A depth of the first holes may be about 2 μm or greater.

The second layer may extend toward the peripheral area, and includes an end spaced from the first valley portion.

According to one or more embodiments, a display apparatus includes a substrate including a display area, and a peripheral area outside the display area, an organic insulating layer on the substrate, and a high refractive index layer on the organic insulating layer in correspondence with the display area, wherein the organic insulating layer defines a first valley portion that surrounds the high refractive index layer in correspondence with the peripheral area, and that defines holes, and wherein the high refractive index layer extends toward the peripheral area, and includes a portion spaced from the first valley portion.

These and/or other aspects will become apparent and more readily appreciated from the following description of the embodiments, the claims, and the accompanying drawings.

BRIEF DESCRIPTION OF THE DRAWINGS

The above and other aspects of some embodiments of the disclosure will be more apparent from the following description taken in conjunction with the accompanying drawings, in which.

DETAILED DESCRIPTION

Figure 1:
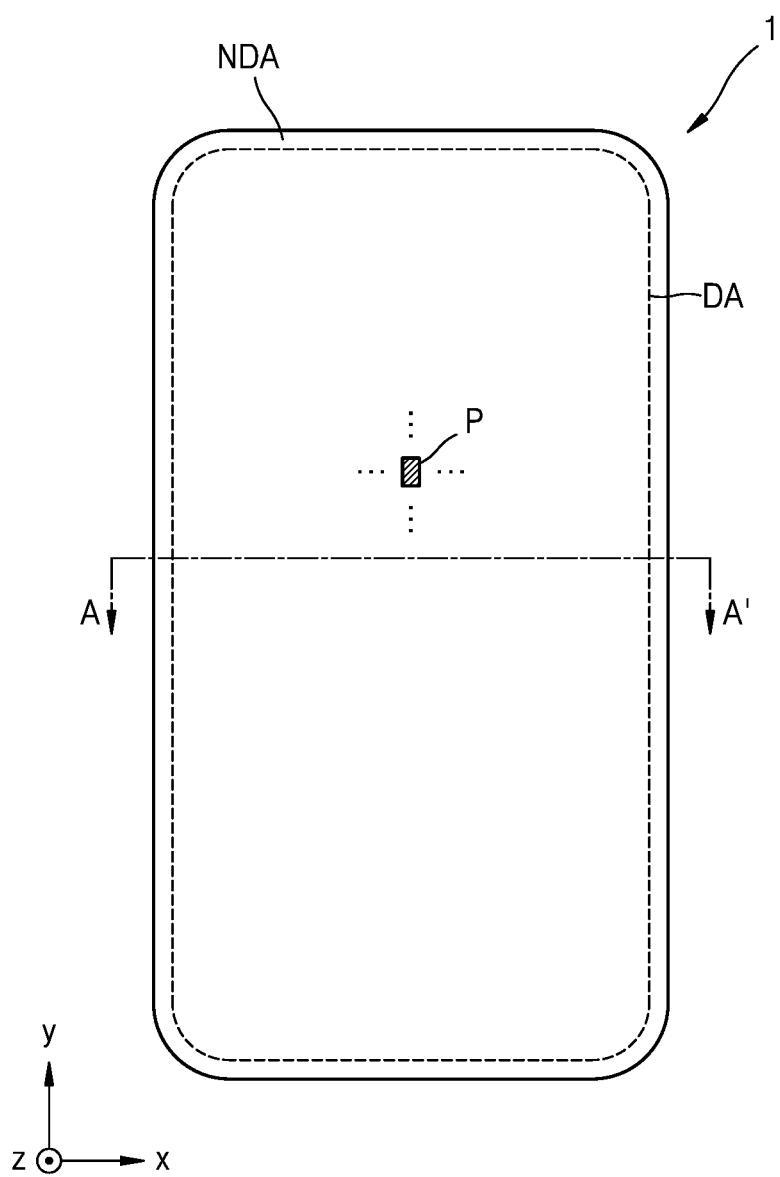
FIG. 1 is a plan view of a portion of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Similarly, the expression "A component X is arranged directly on a component Y" means that there are no adhesion layers/adhesion members arranged between the components X and Y (e.g., the component X is formed on a base surface of the component Y via a consecutive process after the component Y is formed). Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a portion of a display apparatus 1 according to some embodiments.

Referring to FIG. 1, the display apparatus 1 includes a display area DA, and a peripheral area NDA outside the display area DA. A plurality of pixels P including a display element are arranged in the display area DA, and the display apparatus 1 may provide an image by using light that is emitted by the plurality of pixels P arranged in the display area DA. The peripheral area NDA is a non-display area where no display elements are arranged, and the display area DA may be entirely surrounded by the peripheral area NDA.

Although FIG. 1 illustrates the display apparatus 1 including a flat display surface, embodiments of the disclosure are not limited thereto. According to other embodiments, the display apparatus 1 may include a three-dimensional display surface or a curved display surface.

When the display apparatus 1 includes a three-dimensional display surface, the display apparatus 1 may include a plurality of display areas pointing in different directions, and, for example, may include a display surface in the form of a polyprism. According to other embodiments, when the display apparatus 1 includes a curved display surface, the display apparatus 1 may be implemented in various types, such as flexible, foldable, and rollable display apparatuses.

According to some embodiments, FIG. 1 illustrates a display apparatus 1 applicable to mobile phones. For example, electronic modules, a camera module, a power supply module, and the like mounted on a main board may be arranged in a bracket/case or the like together with the display apparatus 1, thereby constituting a mobile phone. The display apparatus 1 according to some embodiments is applicable to not only large-sized electronic apparatuses, such as televisions and monitors, but also small- and medium-sized electronic apparatuses, such as tablets, automobile navigation devices, game players, and smart watches.

FIG. 1 illustrates a case where the display area DA of the display apparatus 1 has a shape of an edge-rounded rectangle. However, according to other embodiments, the shape of the display area DA may be a circle, an oval, or a polygon such as a triangle or a pentagon.

Although an organic light-emitting display apparatus will now be illustrated and described as the display apparatus 1 according to some embodiments of the disclosure, other embodiments are not limited thereto. According to other embodiments, the display apparatus 1 may be an inorganic light-emitting display, a quantum dot light-emitting display, or the like. For example, an emission layer of a display element included in the display apparatus 1 may include an organic material, include an inorganic material, include quantum dots, include an organic material and quantum dots, or include an inorganic material and quantum dots.

Figure 2A:
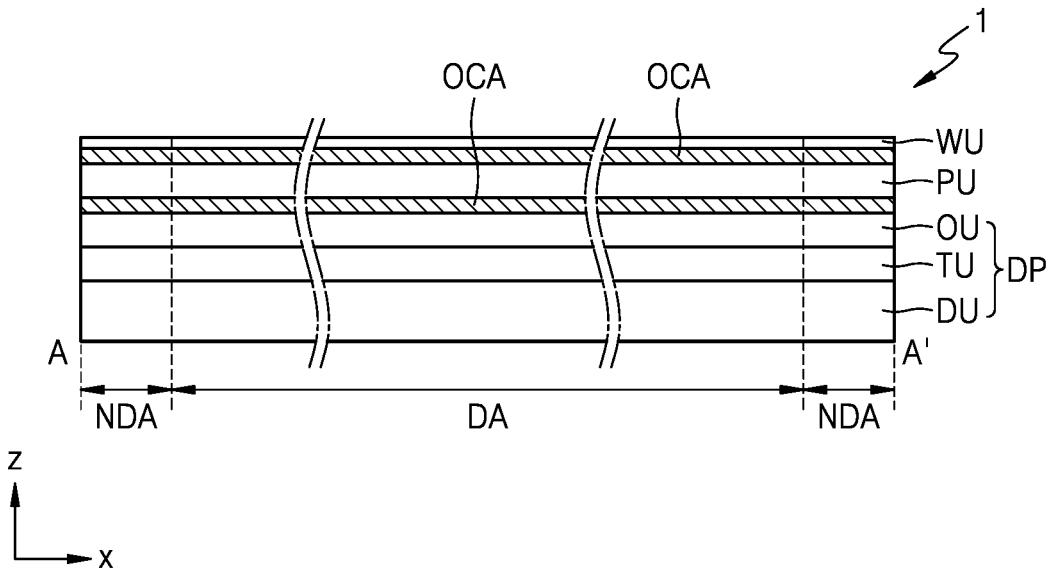
FIGS. 2A and 2B are cross-sectional views taken along the line A-A of the display apparatus of FIG. 1.
Figure 2B:
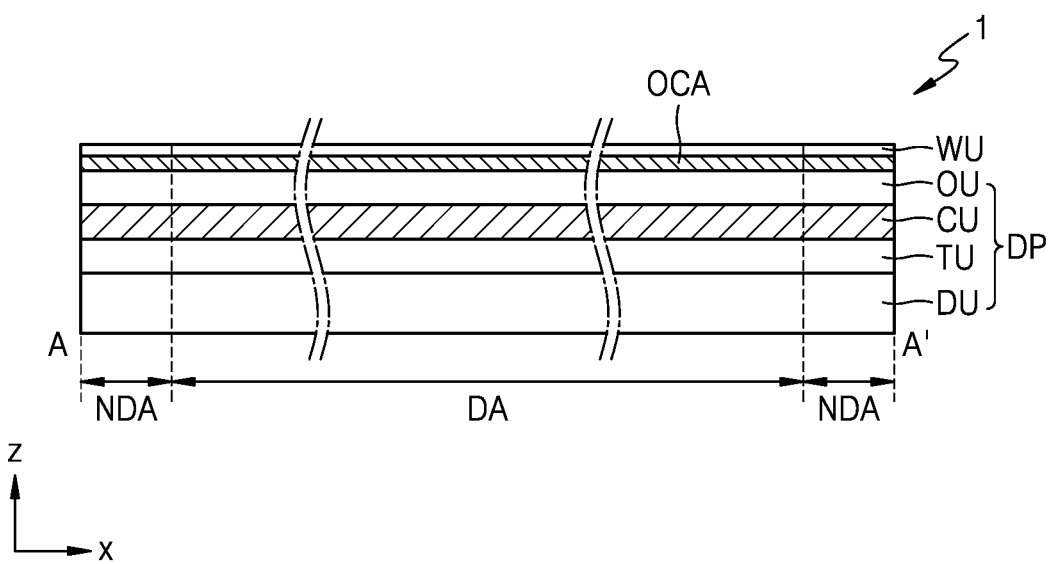
Figure 3:
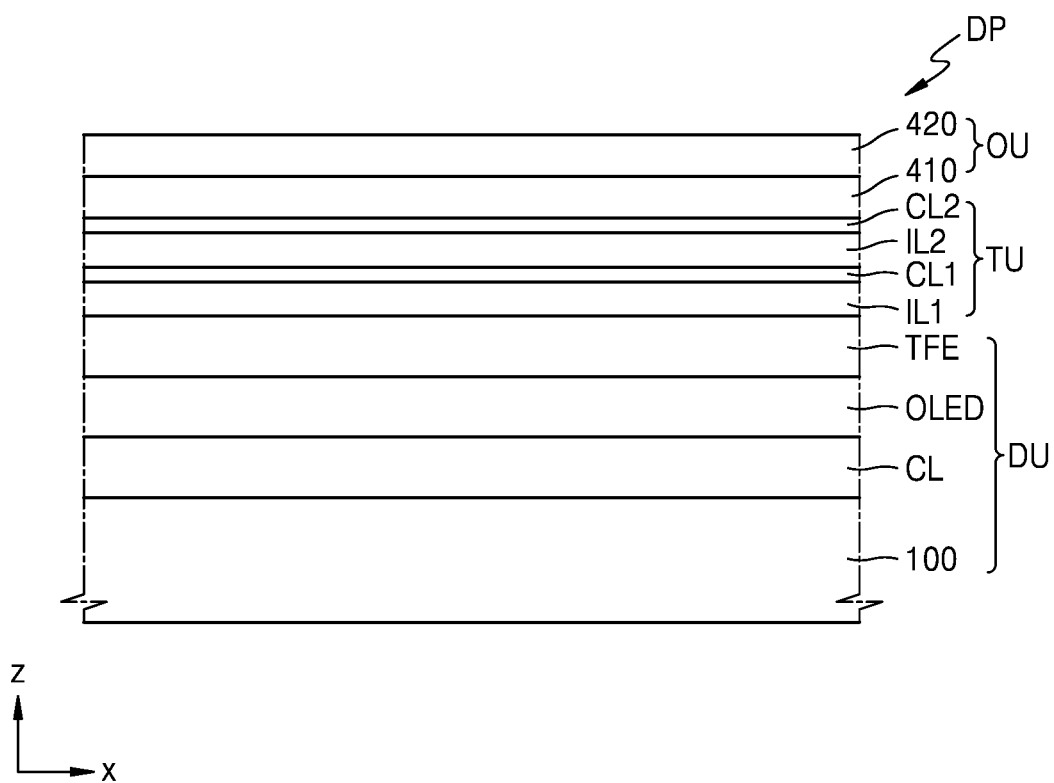
FIG. 3 is a plan view of a portion of a display apparatus according to some embodiments.

FIGS. 2A and 2B are schematic cross-sectional views of the display apparatus 1 of FIG. 1 taken along the line A-A', and FIG. 3 is a schematic plan view of a portion of the display apparatus 1 according to some embodiments. FIGS. 2A, 2B, and 3 are simplified cross-sectional views for explaining a stacking relationship between a functional panel and/or functional layers that constitute the display apparatus 1.

Referring to FIG. 2A, the display apparatus 1 according to some embodiments may include a display layer DU, an input-sensing layer TU, an optical functional layer OU, an anti-reflection layer PU, and a window layer WU. At least some components from among the display layer DU, the input-sensing layer TU, the optical functional layer OU, the anti-reflection layer PU, and the window layer WU may be formed by consecutive processes, or may be combined with each other via an adhesion member. FIG. 2A illustrates an optically clear adhesion member OCA as the adhesion member. An adhesion member to be described hereinafter may include a typical adhesive. According to some embodiments, the anti-reflection layer PU and the window layer WU may be replaced by other components or may be omitted.

According to some embodiments, the input-sensing layer TU is arranged directly on the display layer DU. The combination of the display layer DU, the input-sensing layer TU arranged directly on the display layer DU, and the optical functional layer OU may be defined as a display panel DP. According to some embodiments, as shown in FIG. 2A, optically clear adhesion members OCA may be arranged between the display panel DP and the anti-reflection layer PU and between the anti-reflection layer PU and the window layer WU, respectively.

According to other embodiments, as shown in FIG. 2B, the display panel DP may include a color filter layer CU. The color filter layer CU may be arranged between the input-sensing layer TU and the optical functional layer OU. The color filter layer CU may include a color filter included to correspond to a light-emission region of each pixel P, and a light-shielding layer included to correspond to a non-light-emission region between pixels P. According to some embodiments, optically clear adhesion members OCA may be omitted between the color filter layer CU and the display panel DP, and the color filter layer CU may be directly on the display panel DP.

The display layer DU generates an image, and the input-sensing layer TU obtains coordinate information of an external input (for example, a touch event). The display panel DP according to some embodiments may further include a protection member arranged on a lower surface of the display layer DU. The protection member and the display layer DU may be combined with each other via an adhesion member.

The optical functional layer OU may improve light efficiency. The optical functional layer OU may improve, for example, front light efficiency and/or side visibility of light that is emitted by the organic light-emitting diode OLED.

The anti-reflection layer PU reduces reflectivity of external light that is incident thereon from the top of the window layer WU. The anti-reflection layer PU according to some embodiments may include a phase retarder and a polarizer. The phase retarder may be of a film type or liquid-coating type, and may include a λ/2 phase retarder and/or a λ/4 phase retarder. The polarizer may also be of a film type or liquid-coating type. The film type may include a stretchable synthetic resin film, and the liquid-coating type may include liquid crystals arranged (e.g., arranged in a predetermined arrangement). The phase retarder and the polarizer may further include protective films, respectively. The phase retarder and the polarizer, or the protection film may be defined as a base layer of the anti-reflection layer PU.

The display layer DU, the input-sensing layer TU, and the optical functional layer OU will now be described in detail with reference to FIG. 3.

Referring to FIG. 3, the display panel DP includes the display layer DU and the input-sensing layer TU. The display layer DU is simply illustrated to explain a stacking structure of the input-sensing layer TU. The anti-reflection layer PU of FIG. 2A and the window layer WU of FIG. 2A may be arranged on the input-sensing layer TU in some embodiments.

Figure 8A:
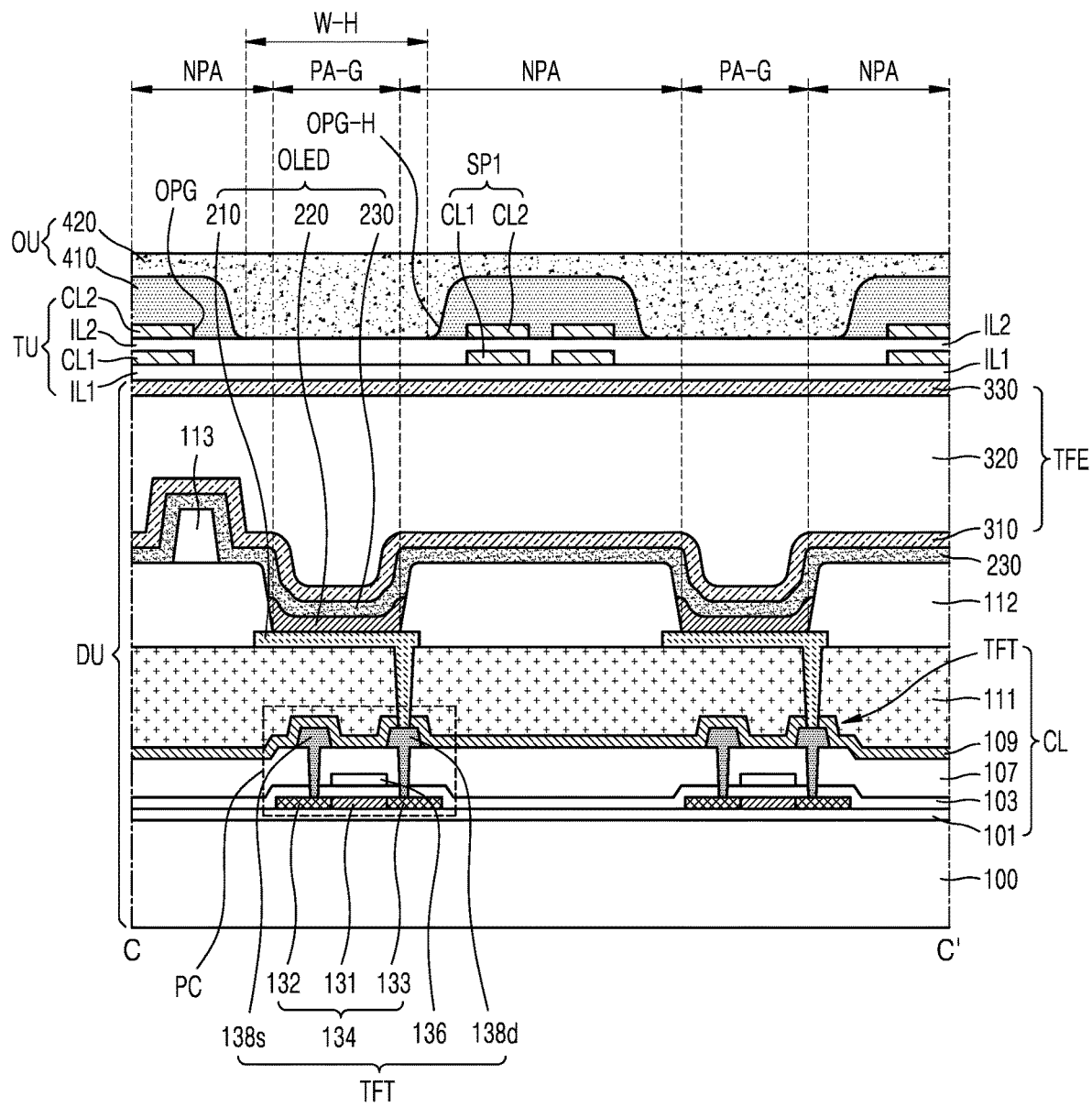
FIGS. 8A through 8E are cross-sectional views taken along the line C-C' of FIG. 7 of a portion of a display area of a display apparatus according to some embodiments.

The display layer DU may be obtained by sequentially arranging a circuit layer CL, an organic light-emitting diode OLED, and a thin-film encapsulation layer TFE on a substrate 100. The input-sensing layer TU may be arranged directly on the thin-film encapsulation layer TFE. The thin-film encapsulation layer TFE includes at least one organic encapsulation layer 320, as shown in FIG. 8A (described later), and thus may provide a flatter base surface. Accordingly, even when the components of the input-sensing layer TU are formed by consecutive processes, a defect rate may be reduced.

The input-sensing layer TU may have a multi-layered structure. The input-sensing layer TU includes a detection electrode, a signal line (or trace line) connected to the detection electrode, and at least one insulating layer. The input-sensing layer TU may detect an external input according to, for example, an electrostatic capacitive method. An operation method of the input-sensing layer TU is not particularly limited in the disclosure. According to some embodiments, the input-sensing layer TU may sense an external input according to an electromagnetic induction method or a pressure detection method.

As shown in FIG. 3, the input-sensing layer TU according to some embodiments may include a first insulating layer IL1, a first conductive layer CL1, a second insulating layer IL2, and a second conductive layer CL2.

For example, each of the first conductive layer CL1 and the second conductive layer CL2 may have a single-layered structure or a stacked multi-layered structure. A conductive layer having a single-layered structure may include a metal layer or a transparent conductive layer. The metal layer may include molybdenum, silver, titanium, copper, aluminum, and an alloy thereof. The transparent conductive layer may include a transparent conductive oxide such as indium tin oxide (ITO), indium zinc oxide (IZO), zinc oxide (ZnO), or indium tin zinc oxide (ITZO). Alternatively, the transparent conductive layer may include a conductive polymer (e.g., PEDOT), metal nano wires, graphene, or the like.

A conductive layer having a multi-layered structure may include a plurality of metal layers. The plurality of metal layers may have, for example, a three-layered structure of titanium/aluminum/titanium (Ti/Al/Ti). The conductive layer having a multi-layered structure may include at least one metal layer and at least one transparent conductive layer.

Each of the first conductive layer CL1 and the second conductive layer CL2 includes a plurality of patterns. It may be hereinafter understood that the first conductive layer CL1 includes first conductive patterns, and that the second conductive layer CL2 includes second conductive patterns. The first conductive patterns and the second conductive patterns may form a detection electrode shown in FIG. 6. According to some embodiments, the detection electrode may have a mesh shape, as will be described later with reference to FIG. 6, which reduces or prevents visual recognition of the detection electrode by a user.

Each of the first insulating layer IL1 and the second insulating layer IL2 may have a single-layered or multi-layered structure. Each of the first insulating layer IL1 and the second insulating layer IL2 may include an inorganic material or a composite material. For example, at least one of the first insulating layer IL1 and the second insulating layer IL2 may include an inorganic layer. The inorganic layer may include at least one of aluminum oxide, titanium oxide, silicon oxide, silicon oxynitride, zirconium oxide, and hafnium oxide. According to other embodiments, the first inorganic insulating layer IL1 and/or the second inorganic insulating layer IL2 may be replaced by an organic insulating layer.

The optical functional layer OU may be directly on the input-sensing layer TU. The optical functional layer OU may include a first layer 410, and a second layer 420 on the first layer 410. The first layer 410 and the second layer 420 may include an organic insulative material, and may be included to have different refractive indexes. According to some embodiments, the refractive index of the second layer 420 (e.g., as a high refractive index layer) may be greater than that of the first layer 410.

Figure 4:
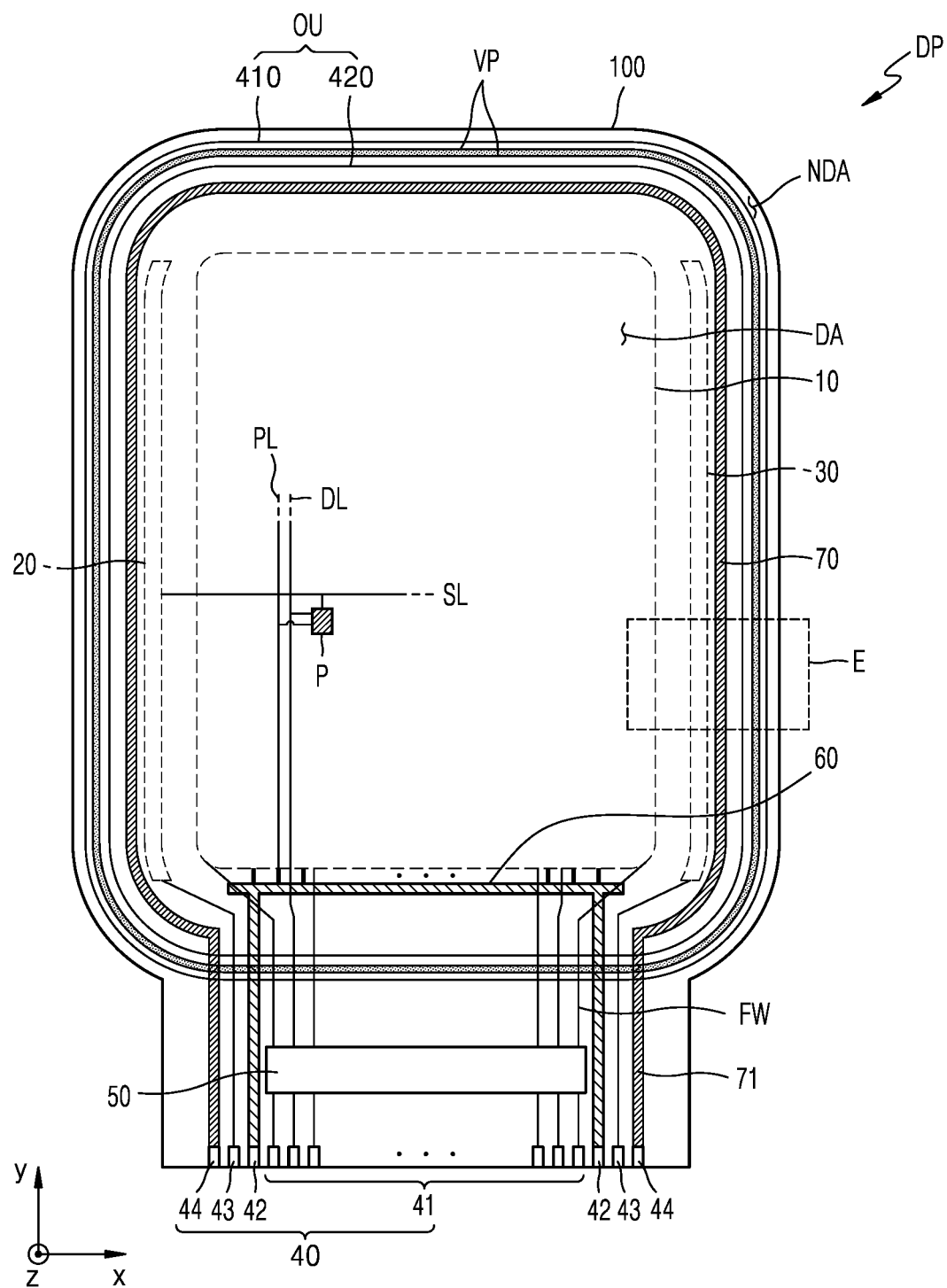
FIG. 4 is a plan view of a display panel of the display apparatus of FIG. 1.

FIG. 4 is a schematic plan view of the display panel DP of the display apparatus 1 of FIG. 1.

Referring to FIG. 4, the display panel DP includes a display 10, first and second scan driving circuits 20 and 30, a terminal portion 40, a data driving circuit 50, a driving voltage supply line 60, and a common voltage supply line (e.g., common power supply line) 70 arranged on the substrate 100. In other embodiments, an emission-control driving circuit may be further arranged on one side of the first scan driving circuit 20.

The substrate 100 may include a material, such as a glass material, metal, or an organic material. According to some embodiments, the substrate 100 may be formed of a flexible material. For example, the substrate 100 may include polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate.

The display 10 includes a scan line SL extending in a first direction (e.g., an x direction), a data line DL extending in a second direction (e.g., a y direction), which crosses the first direction (e.g., the x direction), and pixels P connected to a driving voltage line PL. Each of the pixels P may emit, for example, red, green, blue, and/or white light, and may include, for example, an organic light-emitting diode.

The display 10 provides a certain image via light emitted from the pixels P, and a display area DA is defined by the pixels P. The display 10 may have a shape of an approximate rectangle. However, according to various embodiments, the display 10 may have a shape of a polygon, a circle, or an oval, or a shape corresponding to some of them. The display 10 may include a corner portion that corresponds to a generally rectangular shape but has rounded edges. The substrate 100 on which the display 10 is located may have outer edges of which at least portions are curved.

The first and second scan driving circuits 20 and 30 are arranged on the peripheral area NDA of the substrate 100, and generate and transmit scan signals to each of the pixels P via the scan line SL. For example, the first scan driving circuit 20 may be located on the left side of the display 10, and the second scan driving circuit 30 may be located on the right side of the display 10. The first and second scan driving circuits 20 and 30 are arranged on both sides of the display 10, respectively. However, according to other embodiments, a scan driving circuit may be arranged on one side of the display 10.

The terminal portion 40 is located on one end of the substrate 100 and includes a plurality of terminals 41, 42, 43, and 44. The terminal portion 40 may be exposed without being covered with an insulating layer, and may be electrically connected to a controller such as a flexible printed circuit board or a driver integrated circuit (IC) chip.

The controller changes a plurality of image signals received from an external source into a plurality of image data signals, and transmits the plurality of image data signals to the data driving circuit 50 via the terminal 41. The data driving circuit 50 may generate a data signal, and the generated data signal may be transmitted to the display area DA via fanout wires FW.

The controller may receive a vertical synchronization signal, a horizontal synchronization signal, and a clock signal to generate a control signal for controlling driving of the first and second scan driving circuits 20 and 30, and may transmit the generated control signal to the first and second scan driving circuits 20 and 30 via the terminal(s) 43. The controller transmits a driving voltage ELVDD and a common voltage ELVSS to the driving voltage supply line 60 and the common voltage supply line 70 via the terminals 42 and 44, respectively.

The data driving circuit 50 is on the peripheral area NDA of the substrate 100, and generates and transmits a data signal to each of the pixels P via the data line DL. The data driving circuit 50 may be on one side of the display 10, for example, between the terminal portion 40 and the display 10.

The driving voltage supply line 60 may be on the peripheral area NDA. For example, the driving voltage supply line 60 may be between the data driving circuit 50 and the display 10. The driving voltage supply line 60 provides the driving voltage ELVDD to the pixels P. The driving voltage supply line 60 may extend in the first direction (e.g., the x direction), and may be connected to the plurality of driving voltage lines PL each extending in the second direction (e.g., the y direction).

The common voltage supply line 70 is arranged on the peripheral area NDA, and provides the common voltage ELVSS to an opposite electrode 230 of FIG. 8A of an organic light-emitting diode of each pixel P. For example, the common voltage supply line 70 has a loop shape of which one side is open, and accordingly, may extend along an edge of the substrate 100 with the exception of the terminal portion 40.

The optical functional layer OU may be on the display area DA. The optical functional layer OU may be over the entire surface of the display area DA, and may partially extend to the peripheral area NDA. Substantially, the optical functional layer OU is arranged on the input-sensing layer TU of FIGS. 2A and 3, and may improve luminescent efficiency and side visibility of the pixel P on the display area DA.

The optical functional layer OU may include the first layer 410, and the second layer 420 on the first layer 410. The first layer 410 may extend more toward the peripheral area NDA than the second layer 420 extends, and thus may be closer to the edge of the substrate 100. A valley portion VP to be described later may be on the first layer 410 located on the peripheral area NDA.

The second layer 420 is arranged on the first layer 410 to extend toward the peripheral area NDA, and may be controlled by, or have a shape corresponding to, the valley portion VP. In other words, the second layer 420 may be arranged on the peripheral area NDA to not extend beyond the valley portion VP.

For example, the second layer 420 may be formed using an inkjet method. Because the second layer 420 includes an organic insulative material having good spreadability, the display apparatus 1 needs a structure capable of controlling spreading of the second layer 420 in the edge of the substrate 100.

The valley portion VP may be on the peripheral area NDA to surround the display area DA. The valley portion VP may be on the outside of the common voltage supply line 70. According to some embodiments, the first layer 410 of FIG. 3 may extend toward the peripheral area NDA, and the valley portion VP may be defined by removing a portion of the first layer 410. The valley portion VP may effectively control spreading of the second layer 420 included in the display area DA toward the edge of the substrate 100.

According to some embodiments, the valley portion VP may have a shape of a closed loop to surround the organic layer OL. A structure of the valley portion VP will be described later in detail with reference to FIG. 9 and its subsequent drawings.

Figure 5:
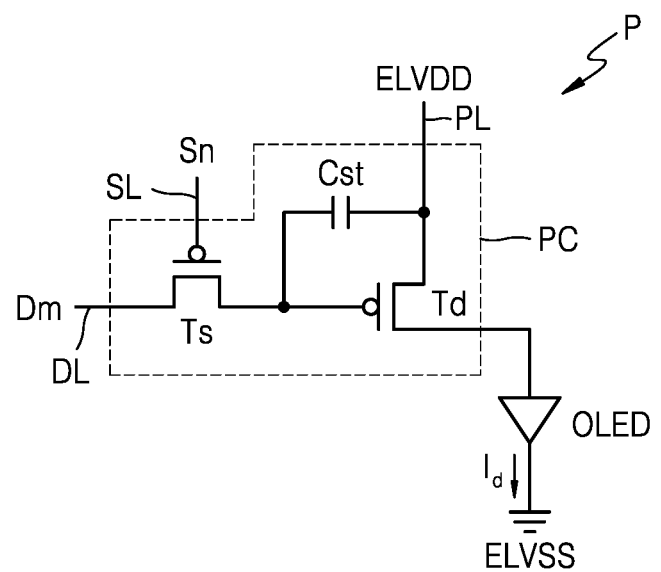
FIG. 5 is an equivalent circuit diagram of a pixel that may be included in a display apparatus according to some embodiments.

FIG. 5 is an equivalent circuit diagram of a pixel P that may be included in the display apparatus 1, according to some embodiments of the disclosure.

Referring to FIG. 5, each pixel P includes a pixel circuit PC connected to a scan line SL and a data line DL, and an organic light-emitting diode OLED connected to the pixel circuit PC.

The pixel circuit PC includes a driving thin-film transistor Td, a switching thin-film transistor Ts, and a storage capacitor Cst. The switching thin-film transistor Ts is connected to the scan line SL and the data line DL, and transmits, to the driving thin-film transistor Td, a data signal Dm received via the data line DL according to a scan signal Sn received via the scan line SL.

The storage capacitor Cst is connected to the switching thin-film transistor Ts and a driving voltage line PL, and stores a voltage corresponding to a difference between a voltage received from the switching thin-film transistor Ts and the driving voltage ELVDD supplied to the driving voltage line PL.

The driving thin-film transistor Td is connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light having a certain brightness by the driving current Id.

Although a case where the pixel circuit PC includes two thin-film transistors and one storage capacitor is illustrated in FIG. 5, the disclosure is not limited thereto. According to other embodiments, the pixel circuit PC may include seven thin-film transistors one storage capacitor. According to other embodiments, the pixel circuit PC may include two or more storage capacitors.

Figure 6:
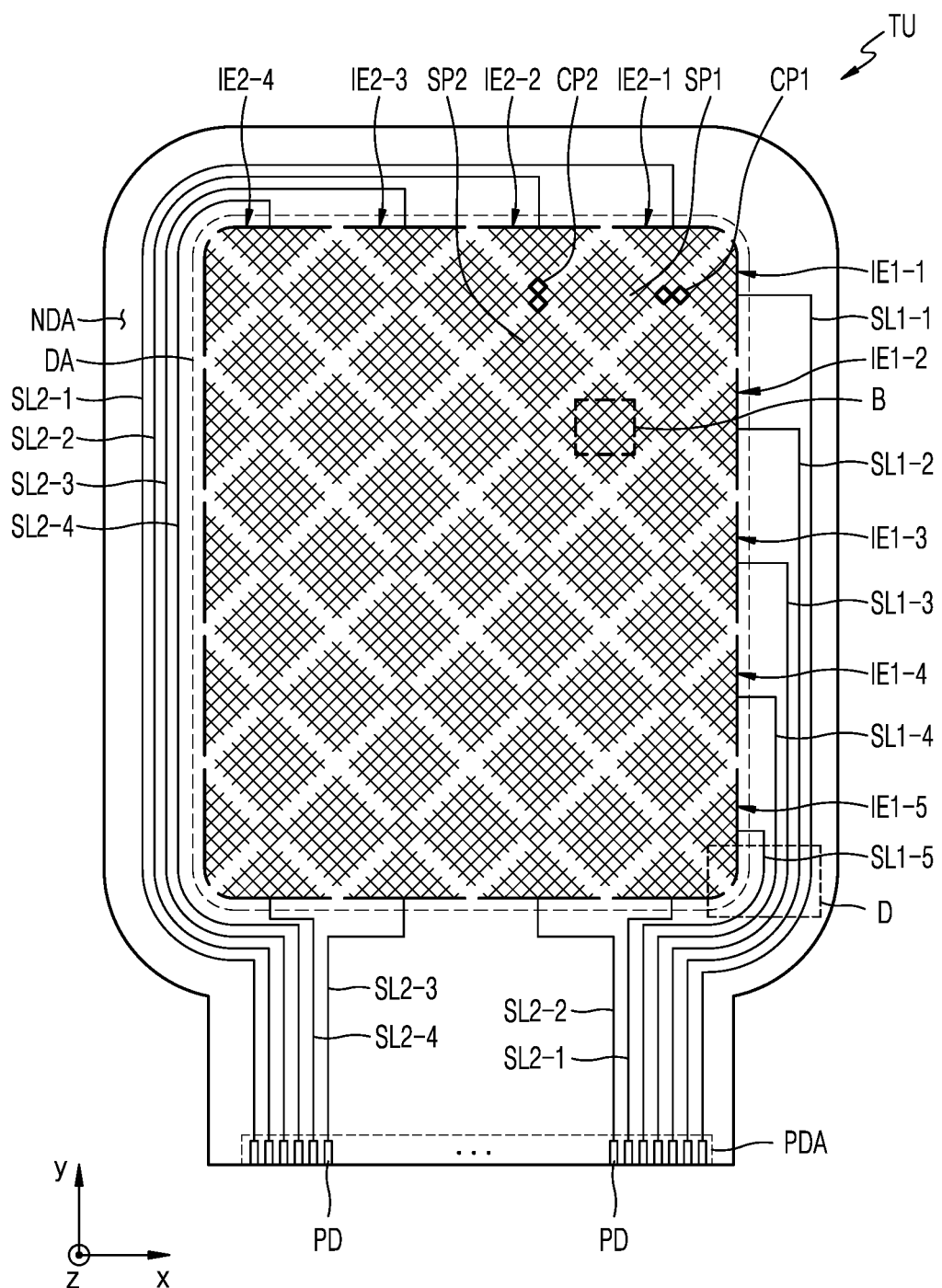
FIG. 6 is a plan view of an input-sensing layer of a display apparatus according to some embodiments.
Figure 7:
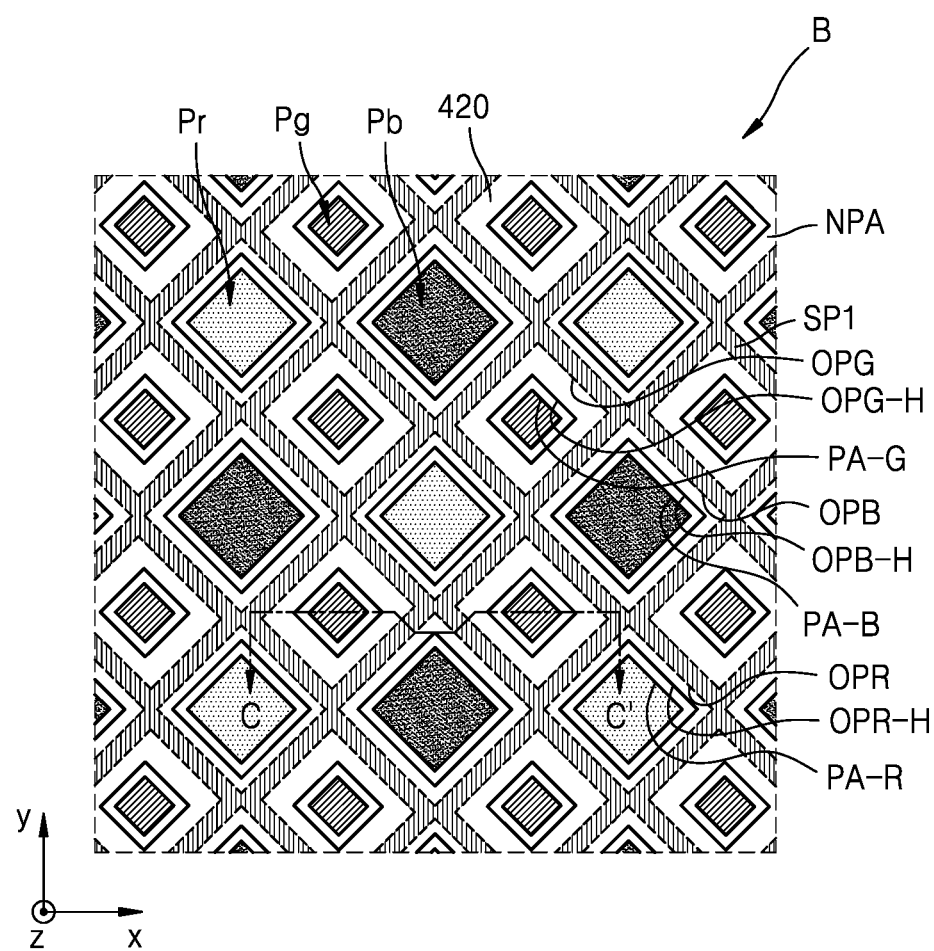
FIG. 7 is a magnified plan view of portion B of FIG. 6.

FIG. 6 is a schematic plan view of an input-sensing layer TU of the display apparatus 1 according to some embodiments of the disclosure, and FIG. 7 is a schematic magnified view of a portion B of FIG. 6.

Referring to FIG. 6, the input-sensing layer TU may include first detection electrodes IE1-1 through IE1-5, first signal lines SL1-1 through SL1-5 respectively connected to the first detection electrodes IE1-1 through IE1-5, second detection electrodes IE2-1 through IE2-4, and second signal lines SL2-1 through SL2-4 respectively connected to the second detection electrodes IE2-1 through IE2-4.

In other embodiments, the input-sensing layer TU may further include optical dummy electrodes arranged on boundary areas between the first detection electrodes IE1-1 through IE1-5 and the second detection electrodes IE2-1 through IE2-4.

The thin-film encapsulation layer TFE of FIG. 3 includes at least one organic encapsulation layer 320 of FIG. 8A, and thus provides a flatter base surface. Accordingly, even when the components of the input-sensing layer TU are formed by consecutive processes, a defect rate may be reduced. Because the first signal lines SL1-1 through SL1-5 and the second signal lines SL2-1 through SL2-4 are arranged in the peripheral area NDA having a reduced step difference, they may have uniform thicknesses. Accordingly, stress of the first signal lines SL1-1 through SL1-5 and the second signal lines SL2-1 through SL2-4, which may be otherwise caused by a step difference of a lower layer, may decrease.

The first detection electrodes IE1-1 through IE1-5 cross the second detection electrodes IE2-1 through IE2-4. The first detection electrodes IE1-1 through IE1-5 may be arranged in the second direction (e.g., they direction), and each of the first detection electrodes IE1-1 through IE1-5 may extend in the first direction (e.g., the x direction). The second detection electrodes IE2-1 through IE2-4 may be arranged in the first direction (e.g., the x direction), and each of the second detection electrodes IE2-1 through IE2-4 may extend in the second direction (e.g., the y direction).

The first detection electrodes IE1-1 through IE1-5 include first sensors SP1, respectively, and first sensor connectors CP1, respectively. The second detection electrodes IE2-1 through IE2-4 include second sensors SP2, respectively, and second sensor connectors CP2, respectively. Two first sensors SP1 on both ends of a first detection electrode from among the first sensors SP1 may have a smaller size than a first sensor SP1 of the first detection electrode (e.g., a size that is about ½ of the size of the first sensor SP1 of the first detection electrode). Two second sensors SP2 on both ends of a second detection electrode from among the second sensors SP2 may have a smaller size than a second sensor SP2 of the second detection electrode (e.g., a size that is about ½ of the size of the second sensor SP2 of the second detection electrode).

FIG. 6 illustrates the first detection electrodes IE1-1 through IE1-5 and the second detection electrodes IE2-1 through IE2-4 according to some embodiments, but the shape thereof is not limited. According to some embodiments, each of the first detection electrodes IE1-1 through IE1-5 and the second detection electrodes IE2-1 through IE2-4 may have a shape (e.g., a bar shape) in which a sensor and a sensor connector are not distinguished from each other. FIG. 6 illustrates the first sensors SP1 and the second sensors SP2 each having a diamond shape, but the disclosure is not limited thereto. Each of the first sensors SP1 and the second sensors SP2 may have any of other polygonal shapes.

The first sensors SP1 within one first detection electrode are arranged in the first direction (e.g., the x direction), and the second sensors SP2 within one second detection electrode are arranged in the second direction (e.g., the y direction). Each of the first sensor connectors CP1 connects respective adjacent ones of the first sensors SP1 to each other, and each of the second sensor connectors CP2 connects respective adjacent ones of the second sensors SP2 to each other.

The first signal lines SL1-1 through SL1-5 are respectively connected to one respective end of the first detection electrodes IE1-1 through IE1-5. The second signal lines SL2-1 through SL2-4 are connected to both ends of the second detection electrodes IE2-1 through IE2-4, respectively. According to other embodiments, the first signal lines SL1-1 through SL1-5 may be respectively connected to both ends of the first detection electrodes IE1-1 through IE1-5. According to other embodiments, the second signal lines SL2-1 through SL2-4 may be connected to a single respective end of the second detection electrodes IE2-1 through IE2-4, respectively.

The first signal lines SL1-1 through SL1-5 and the second signal lines SL2-1 through SL2-4 may be connected to pads PD. The pads PD may be arranged in a pad area PDA.

According to some embodiments, locations of the first signal lines SL1-1 through SL1-5 may be interchanged with those of the second signal lines SL2-1 through SL2-4. For example, in contrast with FIG. 6, the first signal lines SL1-1 through SL1-5 may be arranged on the left side, and the second signal lines SL2-1 through SL2-4 may be arranged on the right side.

Referring to FIGS. 6 and 7, each of the first detection electrodes IE1-1 through IE1-5 and the second detection electrodes IE2-1 through IE2-4 may have a mesh shape. Because each of the first detection electrodes IE1-1 through IE1-5 and the second detection electrodes IE2-1 through IE2-4 has a mesh shape, parasitic capacitance between the first and second detection electrodes IE1-1 through IE1-5 and IE2-1 through IE2-4 and electrodes (for example, an opposite electrode) of the display DU of FIG. 4 may be reduced. As will be described later, the first detection electrodes IE1-1 through IE1-5 and the second detection electrodes IE2-1 through IE2-4 do not overlap light-emission areas PA-R, PA-G, and PA-B, and thus are not visually recognized by a user of the display apparatus 1.

The first detection electrodes IE1-1 through IE1-5 and the second detection electrodes IE2-1 through IE2-4 each having a mesh shape may include metal on which a low-temperature process may be executed, for example, silver, aluminum, copper, chromium, nickel, and titanium. Accordingly, even when the input-sensing layer TU is formed via a consecutive process, damage to an organic light-emitting diode OLED of FIG. 8A may be reduced or prevented.

Referring to FIG. 7, a portion of a first sensor SP1 is magnified and illustrated. The first sensor SP1 does not overlap the light-emission areas PA-R, PA-G, and PA-B, and instead overlaps a non-light-emission area NPA. Each of the light-emission areas PA-R, PA-G, and PA-B may be defined the same as a light-emission area PA of FIG. 7.

Mesh lines of the first sensor SP1 may define a plurality of mesh holes OPR, OPG, and OPB. The mesh lines may have a three-layered structure of Ti/Al/Ti. The mesh holes OPR, OPG, and OPB may have one-to-one correspondence with the light-emission areas PA-R, PA-G, and PA-B.

The light-emission areas PA-R, PA-G, and PA-B may be classified according to the colors of light beams generated by organic light-emitting diodes OLEDs. FIG. 7 illustrates the three light-emission areas PA-R, PA-G, and PA-B that are distinguished by the colors of light respectively emitted thereby. According to some embodiments, the light-emission areas PA-R, PA-G, and PA-B may emit red light, green light, and blue light, respectively.

FIG. 7 illustrates the mesh holes OPR, OPG, and OPB having one-to-one correspondence with the light-emission areas PA-R, PA-G, and PA-B, but the embodiments of the present disclosure are not limited thereto. Each of the mesh holes OPR, OPG, and OPB may correspond to two or more of the light-emission areas PA-R, PA-G, and PA-B. In FIG. 7, planar shapes of the mesh holes OPR, OPG, and OPB correspond to the shapes of the light-emission areas PA-R, PA-G, and PA-B and are thus illustrated as diamond shapes. However, embodiments are not limited thereto. The mesh holes OPR, OPG, and OPB may have, as their planar shapes, polygonal shapes other than the diamond shapes. For example, the mesh holes OPR, OPG, and OPB may have polygonal shapes having rounded corners.

The first layer 410 may be arranged to cover the first sensor SP1. In other words, the first layer 410 may be arranged to cover a second conductive layer CL2 of FIG. 8A that forms the first sensor SP1. In the first layer 410, opening patterns OPR-H, OPG-H, and OPB-H corresponding to respective display elements of the pixels Pr, Pg, and Pb, namely, to the light-emission areas PA-R, PA-G, and PA-B, may be formed. On a plane (e.g., an x-y plane), the area of the opening patterns OPR-H, OPG-H, and OPB-H may be greater than that of the light-emission areas PA-R, PA-G, and PA-B. The opening patterns OPR-H, OPG-H, and OPB-H are located in light extraction directions of the pixels Pr, Pg, and Pb, respectively, to thereby reinforce the straightness of light beams emitted by the light-emission areas PA-R, PA-G, and PA-B, and thus light extraction efficiency may be improved.

FIG. 7 illustrates a first sensor SP1, but each of the second sensors SP2 has substantially the same structure as the first sensor SP1 illustrated in FIG. 7.

FIGS. 8A through 8D are cross-sectional views taken along the line C-C' of FIG. 7 of a portion of a display area of a display apparatus according to some embodiments.

Referring to FIG. 8A, the substrate 100 may include glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 including polymer resin may have flexible, rollable, or bendable characteristics. The substrate 100 may have a multi-layered structure including a layer including the aforementioned polymer resin and an inorganic layer.

The buffer layer 101 may be positioned on the substrate 100 and may reduce or prevent infiltration of a foreign material, moisture, or ambient air from below the substrate 100 and may provide a flat surface on the substrate 100. The buffer layer 101 may include an inorganic material (such as oxide or nitride), an organic material, or an organic and inorganic compound, and may be a single layer or multiple layers of an inorganic material and an organic material. According to some embodiments, the buffer layer 101 may include silicon oxide ($SiO_x$), silicon nitride ($SiN_x$), or/and silicon oxynitride (SiON).

A thin-film transistor TFT and a storage capacitor included at a position corresponding to the display area DA, and an organic light-emitting diode OLED electrically connected to the thin-film transistor TFT and the storage capacitor may be located on the substrate 100.

The thin-film transistor TFT may be on the buffer layer 101. The thin film transistor TFT may include a semiconductor layer 134, a gate electrode 136, a source electrode 138s, and a drain electrode 138d.

The semiconductor layer 134 may include at least one of amorphous silicon (a-Si), polysilicon, an oxide semiconductor, and an organic semiconductor material. According to some embodiments, the semiconductor layer 134 may include low temperature poly-silicon (LTPS). Because a polysilicon material has a high electron mobility (100 $cm^2/Vs$ or greater), energy consumption power is low and reliability is high, and thus may be used as a semiconductor layer of a thin-film transistor of a display apparatus.

The semiconductor layer 134 may include a channel region 131 that is overlapped by the gate electrode 136, and a source region 132 and a drain region 133 located on respective sides of the channel region 131, and including a higher concentration of impurities than the channel region 131. The impurities may include N-type impurities or P-type impurities. The source region 132 and the drain region 133 may be understood as a source electrode and a drain electrode of the thin-film transistor TFT.

A gate insulating layer 103 may be between the semiconductor layer 134 and the gate electrode 136. The gate insulating layer 103 may include silicon oxide ($SiO_x$), silicon nitride ($SiN_x$), or/and silicon oxynitride (SiON), and may be a single layer or multiple layers.

An interlayer insulating layer 107 may be on the gate electrode 136. The interlayer insulating layer 107 may include silicon oxide ($SiO_x$), silicon nitride ($SiN_x$), or/and silicon oxynitride (SiON), and may be a single layer or multiple layers.

The thin film transistor TFT may include the source electrode 138s and the drain electrode 138d respectively connected to the source region 132 and the drain region 133 of the semiconductor layer 134. The source electrode 138s and the drain electrode 138d may be electrically connected to the source region 132 and the drain region 133 of the semiconductor layer 134, respectively, via a contact hole that penetrates through the gate insulating layer 103 and the interlayer insulating layer 107.

The source electrode 138s and the drain electrode 138d may include aluminum (Al), copper (Cu), or titanium (Ti), and may be formed as a single layer or as a multi-layer. According to some embodiments, the source electrode 138s and the drain electrode 138d may have a multi-layer structure, such as Ti/Al/Ti or TiN/Al/Ti.

In other embodiments, the data line DL of FIG. 4 and the driving voltage line PL of FIG. 4 may be formed on the same layer as the source electrode 138s and the drain electrode 138d, and may include the same material as the source electrode 138s and the drain electrode 138d.

According to some embodiments, the thin-film transistor TFT may be covered by a protection layer 109. The protection layer 109 may reduce or prevent exposure of a wire including metal that may be damaged by an etchant, like aluminum, to an etching environment occurring during the manufacture of the display apparatus. The protection layer 109 may extend to the peripheral area NDA. In some cases, the protection layer 109 may be omitted.

A planarization layer 111 that planarizes an upper surface of the thin-film transistor TFT may be arranged on the protection layer 109. An upper surface on which a pixel electrode 210 is to be arranged may be planarized by the planarization layer 111. The planarization layer 111 may include an organic insulative material and may be a single layer or multiple layers.

The pixel electrode 210 is on the planarization layer 111. The pixel electrode 210 may be a (semi) light-transmissive electrode or a reflective electrode. According to some embodiments, the pixel electrode 210 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the pixel electrode 210 may have a stack structure of ITO/Ag/ITO.

The pixel-defining layer 112 may be on the pixel electrode 210, and the pixel-defining layer 112 may have an opening corresponding to each (sub)pixel. The pixel-defining layer 112 may define a light-emission area PA-G by including an opening pattern OPG-H via which at least a center portion of the pixel electrode 210 is exposed. The pixel-defining layer 112 may reduce or prevent the likelihood of an arc or the like occurring between an edge of the pixel electrode 210 and the opposite electrode 230 by increasing a distance between the edge of the pixel electrode 210 and the opposite electrode 230. The pixel-defining layer 112 may include an organic material, for example, polyimide or hexamethyldisiloxane (HMDSO).

According to some embodiments, a spacer 113 may be on the pixel-defining layer 112. According to some embodiments, the spacer 113 may be located at the peripheral area NDA. In other embodiments, the spacer 113 may be located at the display area DA. The spacer 113 may reduce or prevent the likelihood of damage to the organic light-emitting diode OLED due to sagging of a mask in a manufacturing process of using the mask. The spacer 113 may include an organic insulative material and may be a single layer or multiple layers.

The planarization layer 111, the pixel-defining layer 112, and the spacer 113 may include an organic insulative material. The organic insulative material may include an imide-based polymer, a commercial polymer such as polymethyl methacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, a blend thereof, or the like. According to some embodiments, the planarization layer 111 may include polyimide.

An intermediate layer 220 is between the pixel electrode 210 and the opposite electrode 230. The intermediate layer 220 may include a low-molecular weight or high-molecular weight material.

When the intermediate layer 220 includes a low-molecular weight material, the intermediate layer 220 may be formed by stacking a hole injection layer (HIL), a hole transport layer (HTL), an emission layer (EML), an electron transport layer (ETL), and an electron injection layer (EIL) in a single structure or in a composite structure, and may include any of various materials, such as copper phthalocyanine (CuPc), N, N'-Di(naphthalene-1-yl)-N,N'-diphenyl-benzidine (NPB), or tris-8-hydroxyquinoline aluminum (Alq3). These layers may be formed via vacuum deposition.

When the intermediate layer 220 includes a high-molecular weight material, the intermediate layer 220 may generally have a structure including an HTL and an EML. In this case, the HTL may include poly(ethylenedioxythiophene) (PEDOT), and the EML may include a high-molecular weight material such as a polyphenylene vinylene (PPV)-based material or a polyfluorene-based material.

The intermediate layer 220 is not limited to the above-described structure, and may have any of various other structures. For example, at least one of the layers that constitute the intermediate layer 220 may be integrally formed with the opposite electrode 230. According to other embodiments, the intermediate layer 220 may include a layer that is patterned to correspond to each of a plurality of pixel electrodes 210.

Figure 10:
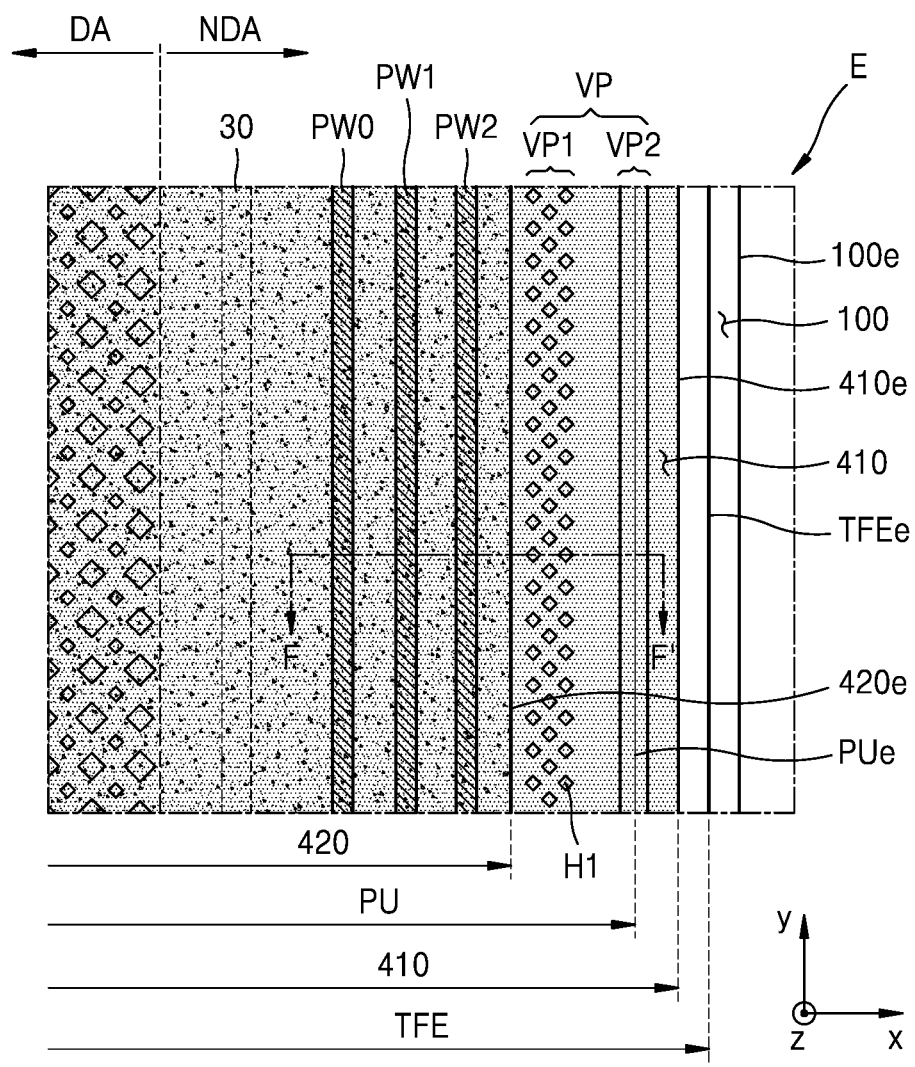
FIG. 10 is a magnified plan view of portion E of FIG. 4.

The opposite electrode 230 may be arranged on the display area DA and may cover the entire display area DA. In other words, the opposite electrode 230 may be formed as a single body covering the entire display area DA. A portion of the opposite electrode 230 may extend to the peripheral area NDA. As shown in FIG. 10, the opposite electrode 230 may extend to a partition wall (for example, a first partition wall PW1) arranged in the peripheral area NDA, and thus may electrically contact the common voltage supply line 70.

The thin-film encapsulation layer TFE may include at least one organic encapsulation layer and at least one inorganic encapsulation layer. According to some embodiments, the thin-film encapsulation layer TFE may include a first inorganic encapsulation layer 310, a second inorganic encapsulation layer 330, and an organic encapsulation layer 320 therebetween.

Each of the first and second inorganic encapsulation layers 310 and 330 may include one or more inorganic insulative materials. The inorganic insulative materials may include, for example, aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. Examples of the polymer-based material may include an acrylic resin, an epoxy-based resin, polyimide, and polyethylene. For example, the organic encapsulation layer 320 may include an acrylic resin, for example, polymethyl methacrylate or polyacrylic acid. The organic encapsulation layer 320 may be formed by curing a monomer or by coating a polymer.

The thin-film encapsulation layer TFE may cover the entirety of the display area DA, and may extend toward the peripheral area NDA to cover a portion of the peripheral area NDA. The thin-film encapsulation layer TFE may extend to the outside of, or to be beyond, the common voltage supply line 70.

The input-sensing layer TU includes a first inorganic insulating layer IL1, a first conductive layer CL1 on the first inorganic insulating layer IL1, a second inorganic insulating layer IL2 on the first conductive layer CL1, and a second conductive layer CL2 on the second inorganic insulating layer IL2. The first conductive layer CL1 and the second conductive layer CL2 may correspond to the first sensor SP1 of FIG. 7. As described above, the first sensor SP1 might not overlap the light-emission area PA-G, and instead may overlap the non-light-emission area NPA. In other embodiments, the first conductive layer CL1 and the second conductive layer CL2 may be electrically connected to each other via a contact hole defined in the second inorganic insulating layer IL2, in some areas.

The optical functional layer OU may be on the input-sensing layer TU. The optical functional layer OU may include a first layer 410 that covers the second conductive layer CL2, and that is arranged on the second inorganic insulating layer IL2, and a second layer 420 that is arranged on the first layer 410.

The opening pattern OPG-H may be arranged on the first layer 410 to correspond to the light-emission area PA-G. A width W-H of the opening pattern OPG-H may be greater than that of the light-emission area PA-G in the same direction. This may mean that, as described above with reference to FIG. 7, the area of the opening pattern OPG-H is greater than that of the light-emission area PA-G on a plane (e.g., the x-y plane, or in a plan view). The opening pattern OPR-H is located in the light extraction direction of the pixel Pg to thereby reinforce the straightness of light emitted by the light-emission area PA-G, and thus light extraction efficiency may be improved.

To further improve the above-described light extraction efficiency, the second layer 420 having a higher refractive index than the refractive index of the first layer 410 may be further arranged on the first layer 410. The first layer 410 may include an organic insulative material having a first refractive index, and the second layer 420 may include an organic insulative material having a second refractive index.

The first refractive index of the first layer 410 may be in the range of about 1.3 to about 1.6. According to some embodiments, the first refractive index of the first layer 410 may be in the range of about 1.4 to about 1.55. The first layer 410 may include, for example, (ethyl)hexyl acrylate, pentafluoropropyl acrylate, poly(ethylene glycol) dimethacrylate, ethylene glycol dimethacrylate, or the like. According to some embodiments, the first layer 410 may include an acrylic organic material having a refractive index of about 1.5. Alternatively, the first layer 410 may include a material included in the organic encapsulation layer 320 of the thin-film encapsulation layer TFE. According to some embodiments, the first layer 410 may include an epoxy-based organic material, and in some cases, may also include a photocurable material.

The second layer 420 may be a planarization layer having a second refractive index. The second refractive index of the second layer 420 may be in the range of about 1.65 to about 1.85. The second layer 420 may include, for example, polydiarylsiloxane, methyltrimethoxysilane, tetramethoxysilane, or the like. According to some embodiments, the second layer 420 may include an acrylic and/or siloxane-based organic material having a refractive index of about 1.6. According to other embodiments, the second layer 420 may include dispersed particles to have a high refractive index. In the second layer 420, metal oxide particles, for example, zinc oxide (ZnOx), titanium oxide ($TiO_2$), zirconium oxide ($ZrO_2$), or barium titanate ($BaTiO_3$), may be dispersed therein.

Figure 8B:
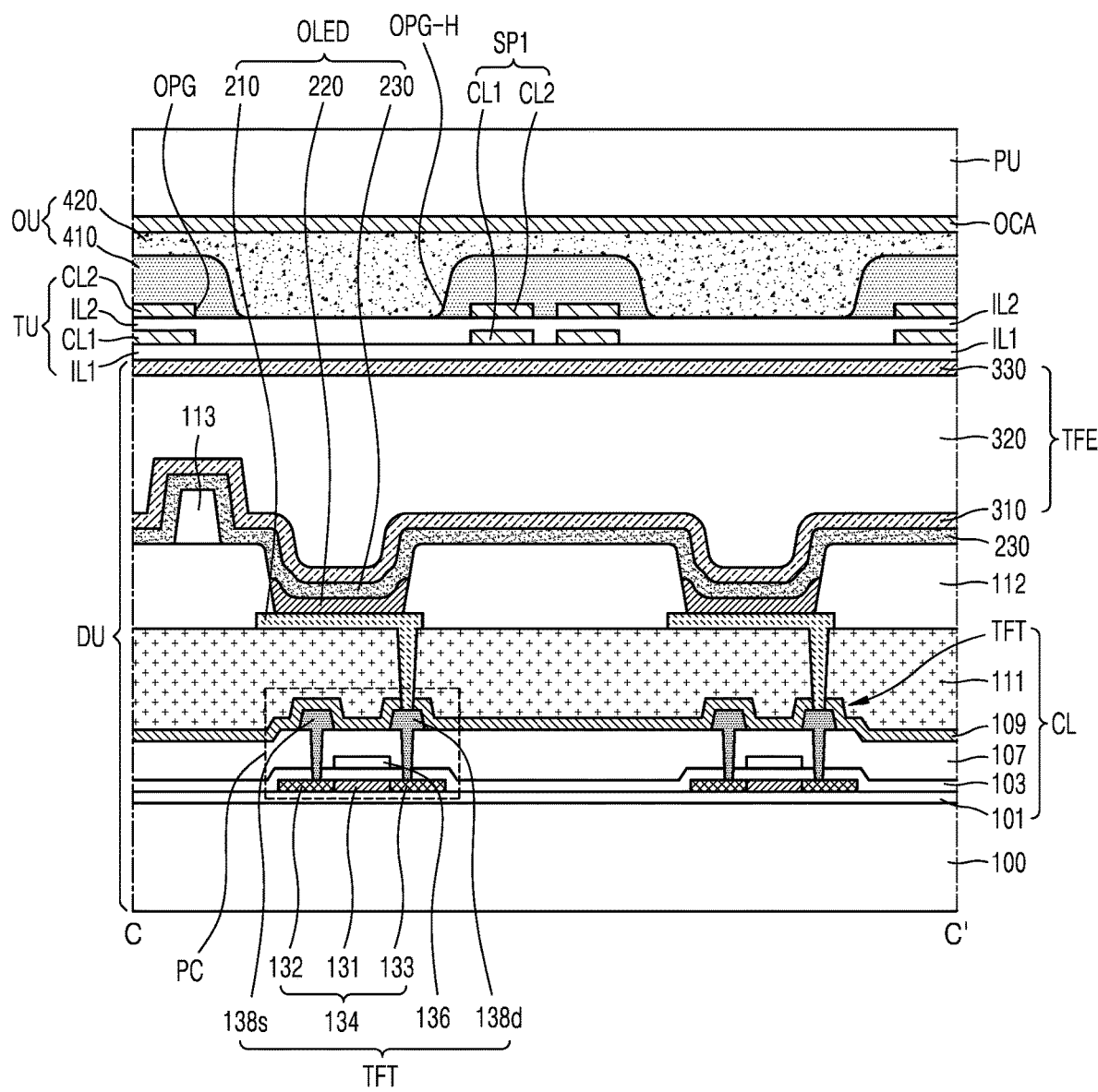

The anti-reflection layer PU may be arranged on the optical functional layer OU, as shown in FIG. 8B. The anti-reflection layer PU may be attached onto the optical functional layer OU by an optically clear adhesion member OCA.

Figure 8C:
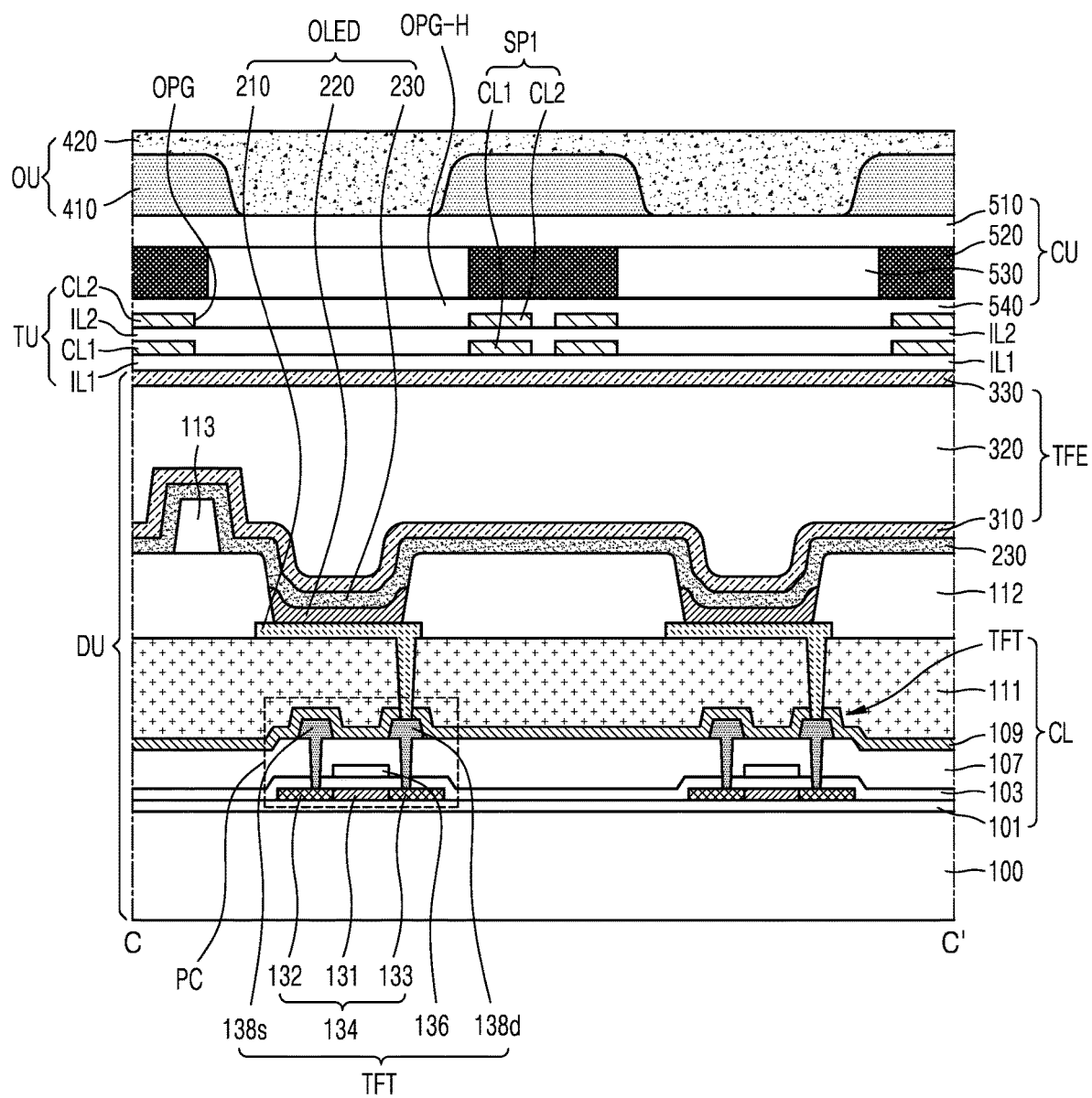

According to other embodiments, the color filter layer CU may be arranged on the input-sensing layer TU as shown in FIG. 8C, and the optical functional layer OU may be arranged on the color filter layer CU. The color filter layer CU may include a base layer 510, a light-shielding layer 520, color filters 530, and an overcoat layer 540. According to some embodiments, the base layer 510 may be omitted.

The color filters 530 may be arranged by taking into account the colors of light beams respectively emitted by the pixels of the display panel DP. For example, each color filter 530 may have a red, green, or blue color according to the color of light emitted by the organic light-emitting diode OLED. The light-shielding layer 520 may include a pigment or dye having a black color in an insulating material (e.g., an organic insulating material). The light-shielding layer 520 may be, for example, a black matrix. The overcoat layer 540 may be between the color filters 530 and the input-sensing layer TU, may include an organic material, such as resin, and may have a light transmission property.

Figure 8D:
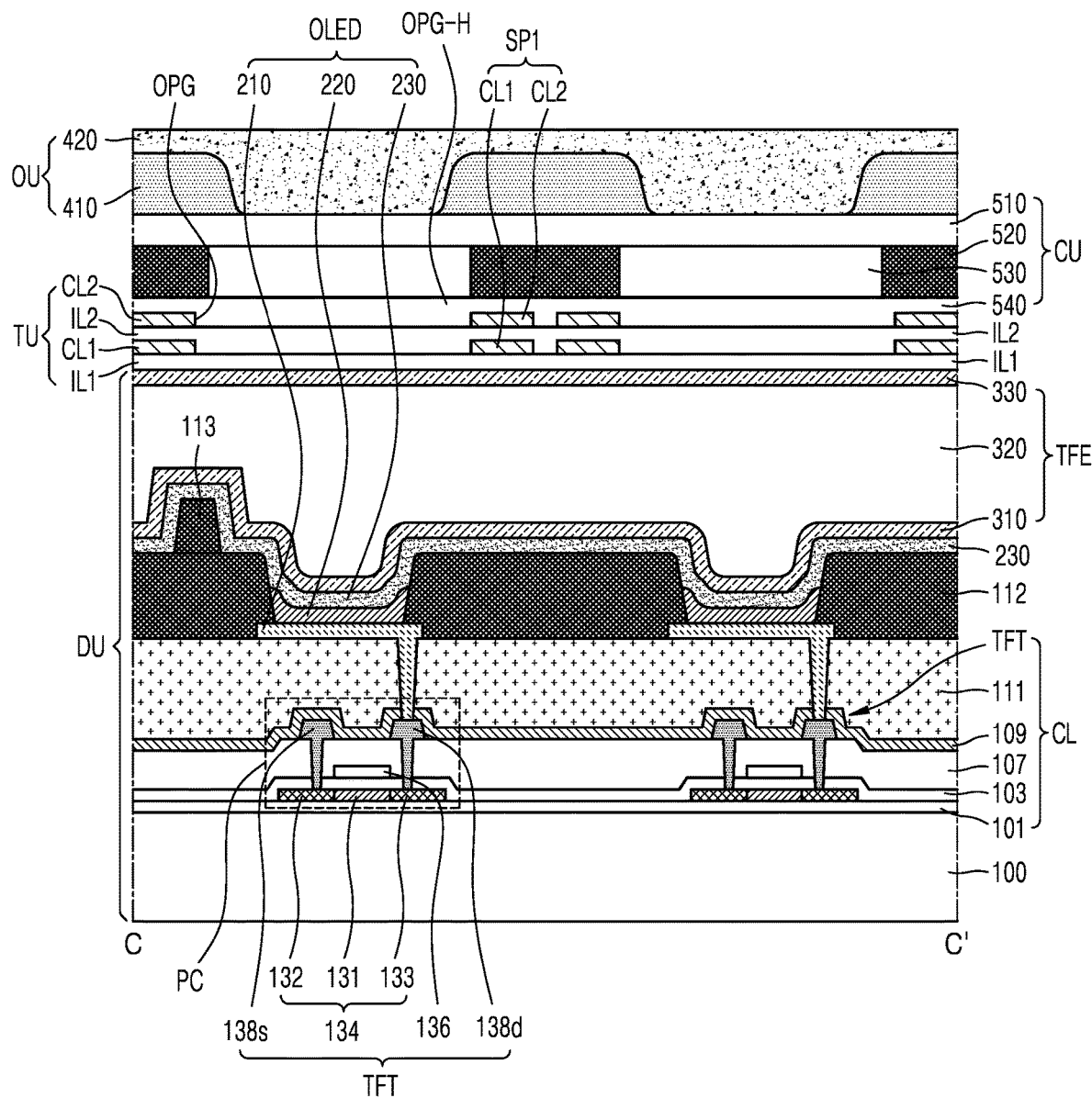

According to other embodiments, to maximize an effect of the color filter layer CU, the pixel-defining layer 112 and/or the spacer 113 may include a black light-shielding material, as shown in FIG. 8D. In this case, the pixel-defining layer 112 and/or the spacer 113 may be included as, for example, a back matrix. The light-shielding layer 520 may be arranged to correspond to the non-light-emission area NPA, thereby reducing or preventing color mixture due to light leakage between pixels P. Furthermore, the pixel-defining layer 112 and/or the spacer 113 may further perform a light-shielding function along with the light-shielding layer 520, thereby increasing or maximizing an effect of the color filter layer CU. The anti-reflection layer PU of FIG. 8A may be omitted in some embodiments.

Figure 8E:
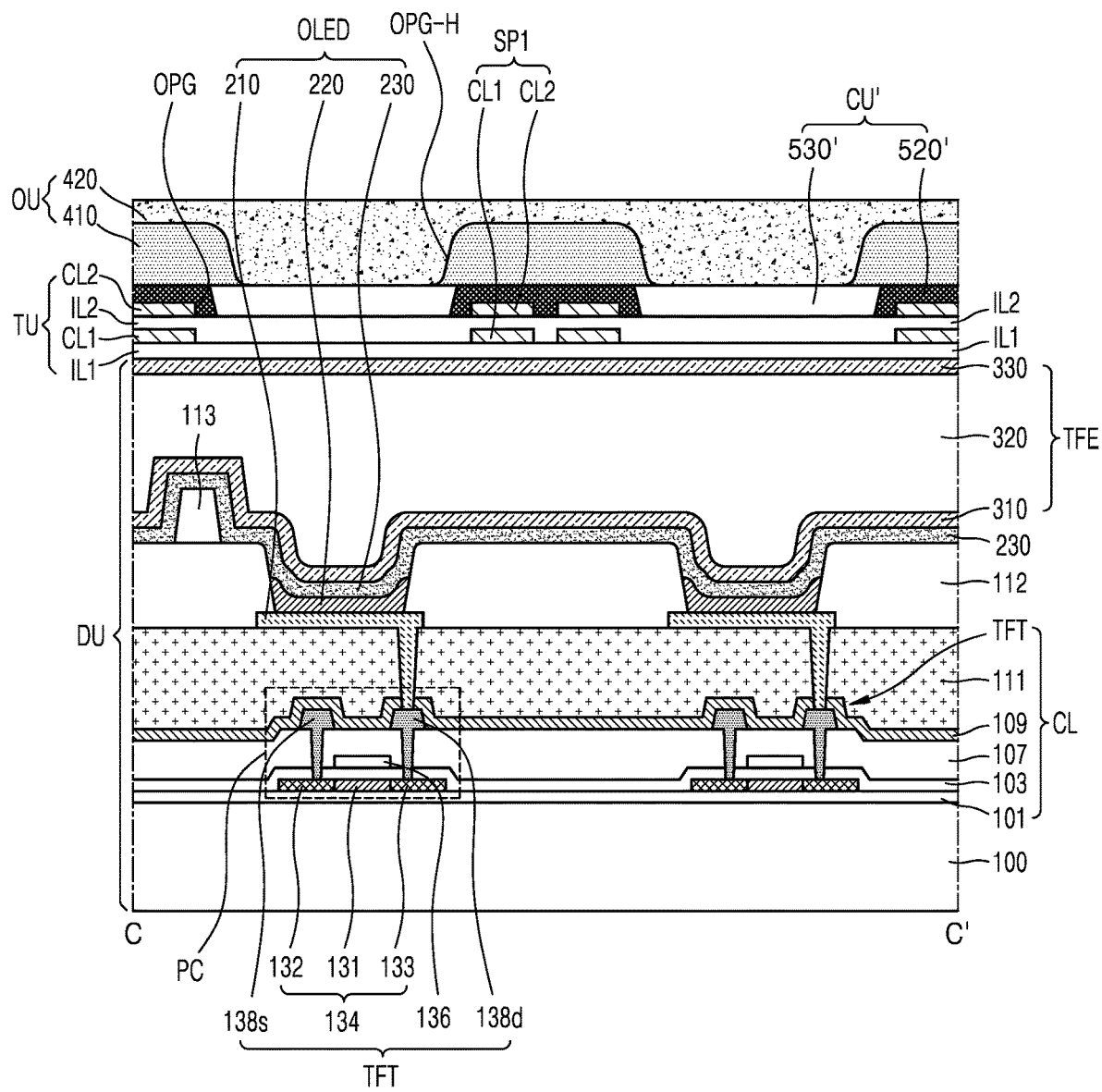

According to other embodiments, a color filter layer CU' may be arranged on the input-sensing layer TU, as shown in FIG. 8E, and the color filter layer CU' may include a light-shielding layer 520' and color filters 530'. The light-shielding layer 520' may be located in the non-light-emission area NPA, and may surround the light-emission area PA-G.

According to some embodiments, the light-shielding layer 520' may passivate a touch electrode of the input-sensing layer TU. For example, as shown in FIG. 8E, the second conductive layer CL2 of the input-sensing layer TU including the touch electrode may be overlapped by the light-shielding layer 520' and may be covered by the light-shielding layer 520'.

Figure 9:
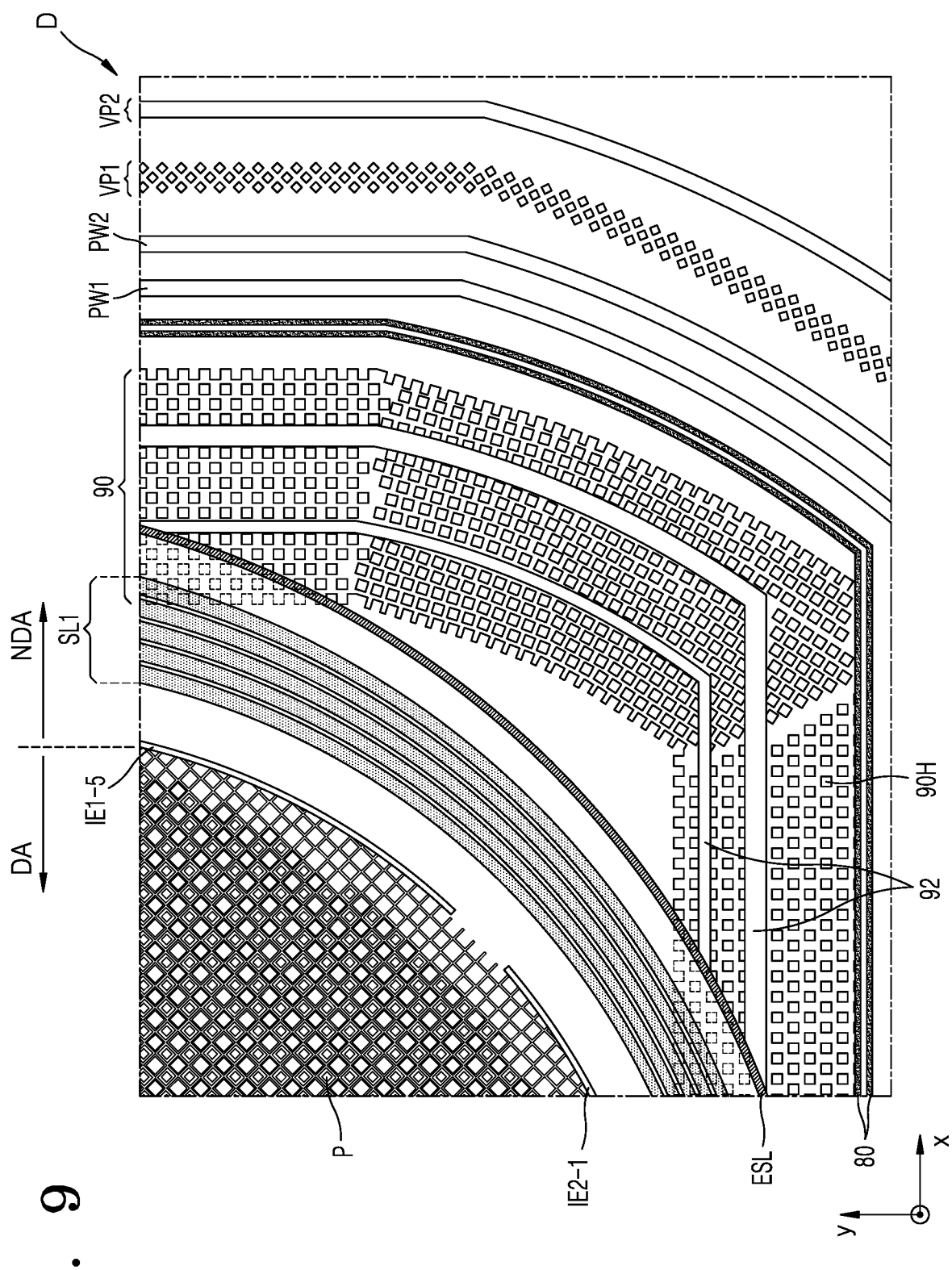
FIG. 9 is a magnified plan view of portion D of FIG. 6.
Figure 11A:
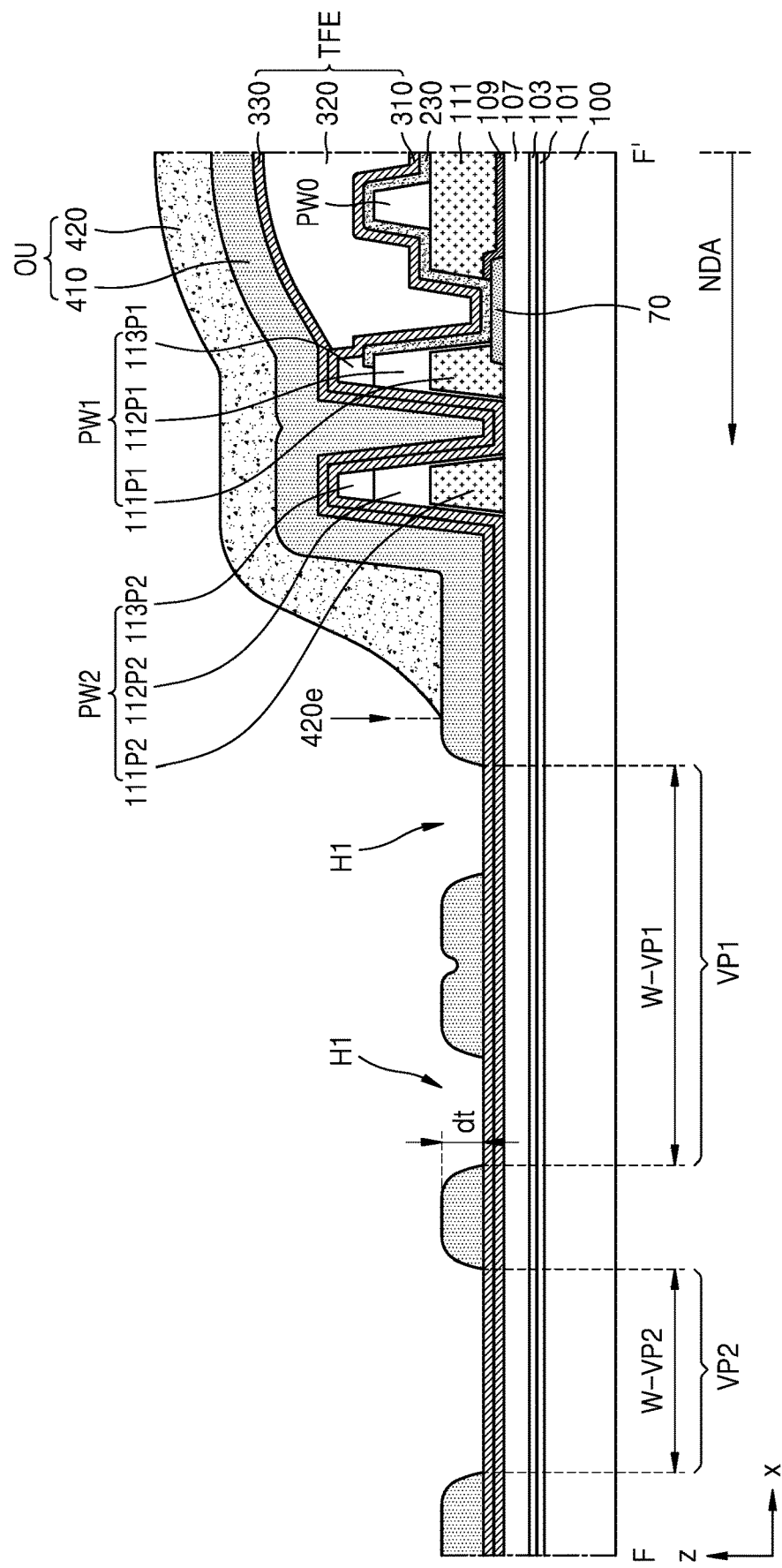
FIG. 11A is a cross-sectional view taken along the line F-F' of FIG. 9.
Figure 11B:
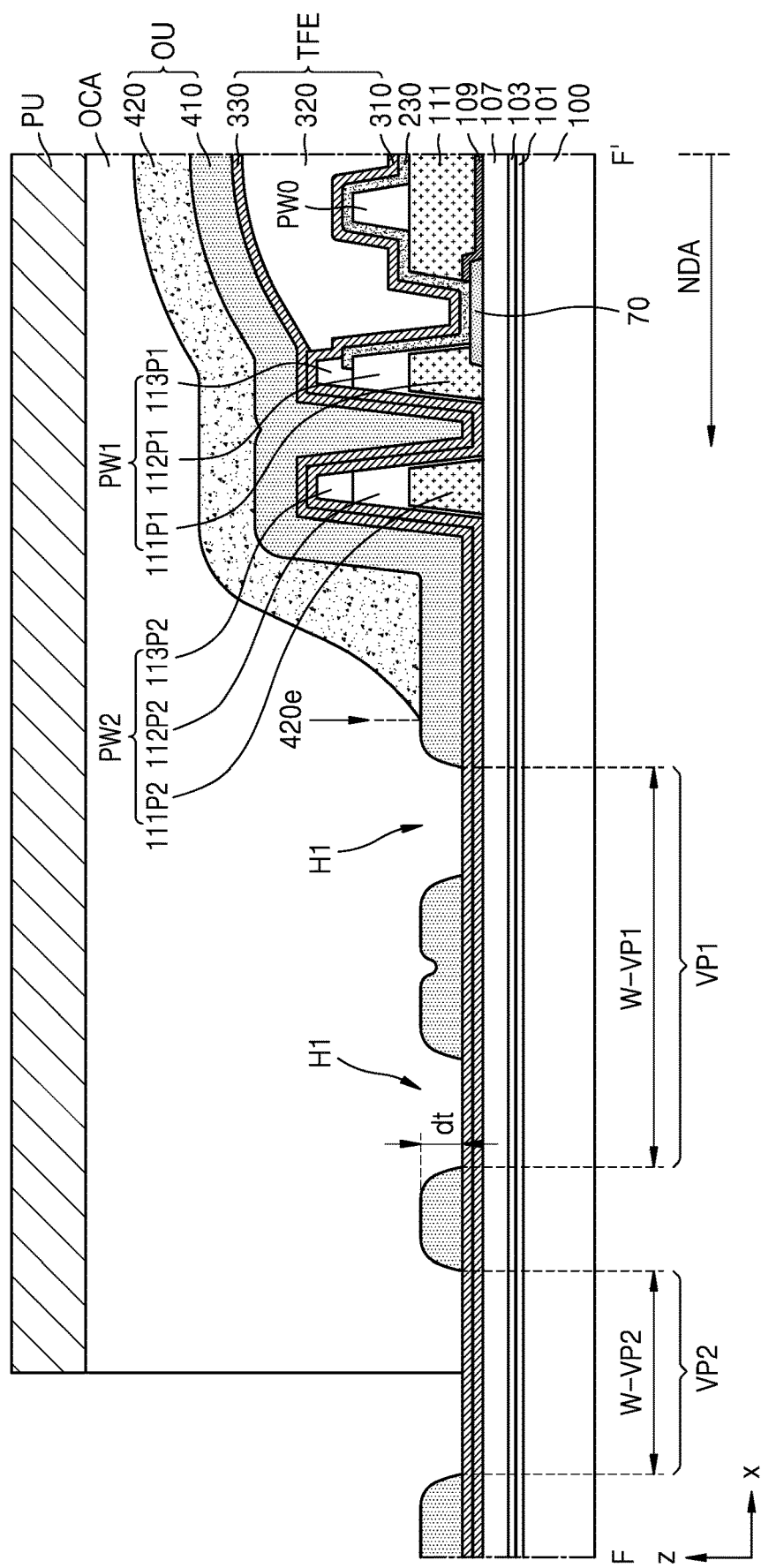
FIGS. 11B, 11C, and 12 are modifications of FIG. 10.
Figure 11C:
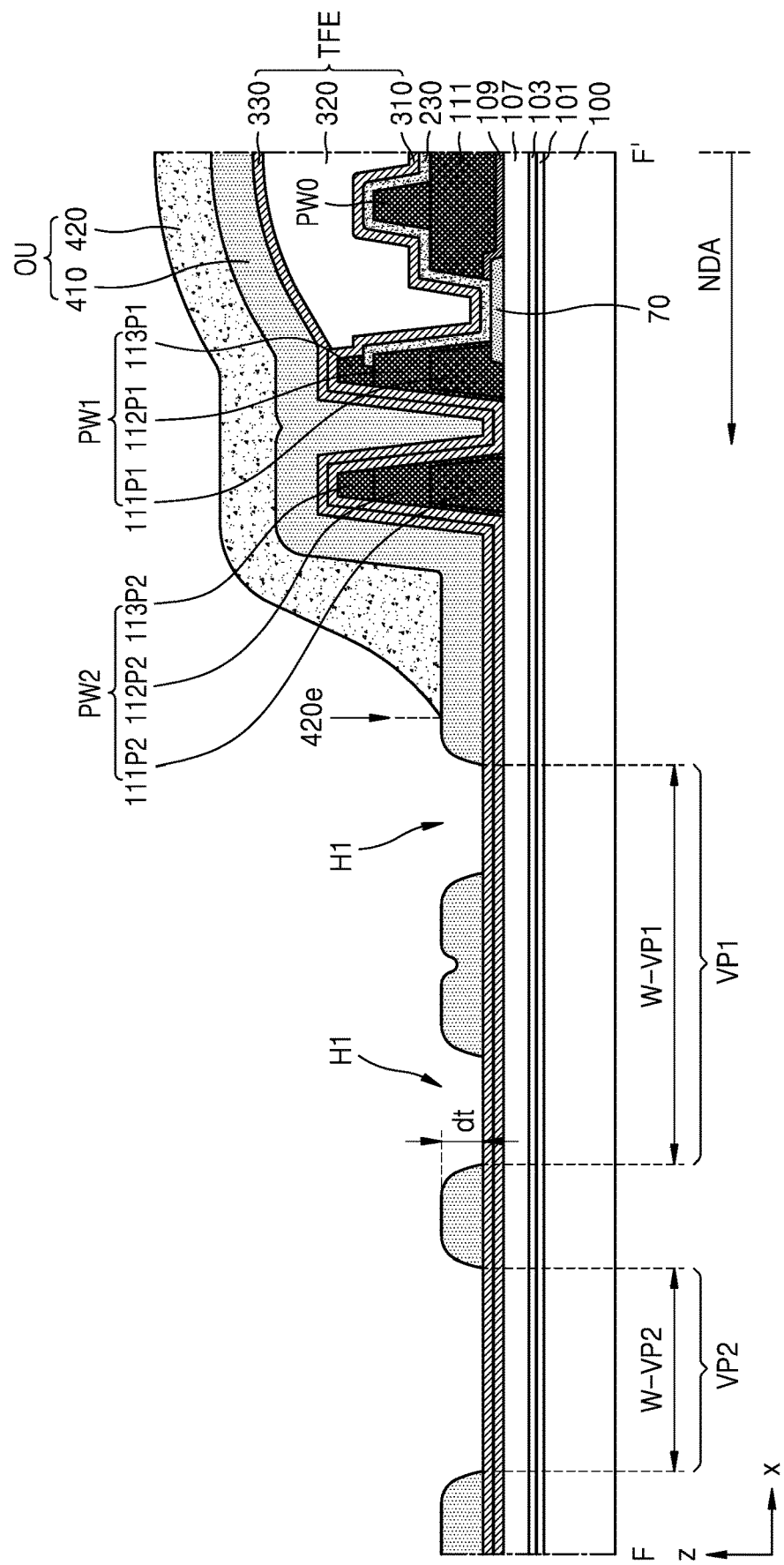
Figure 12:
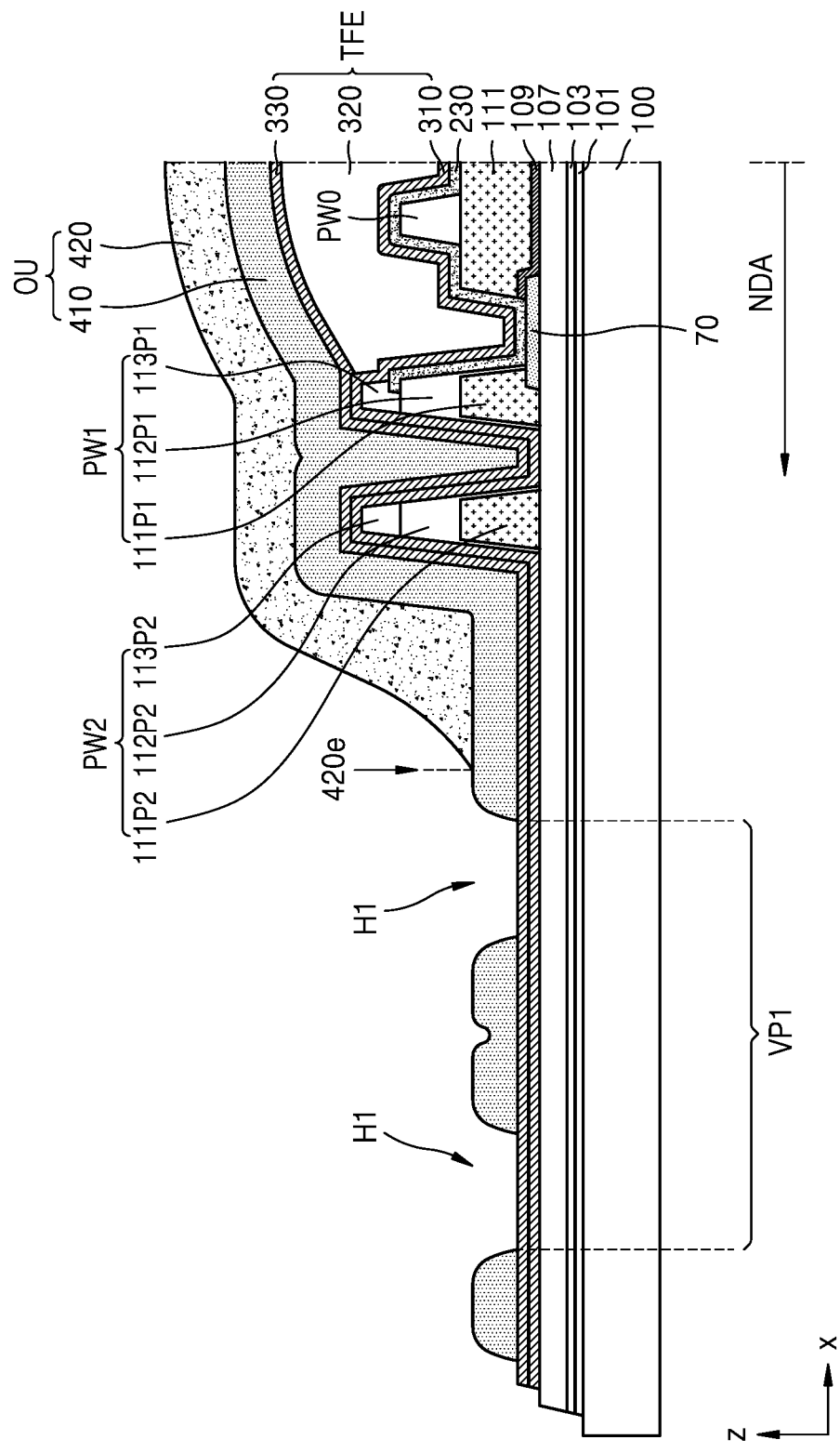

FIG. 9 is a magnified plan view of a portion D of FIG. 6, FIG. 10 is a magnified plan view of a portion E of FIG. 4, and FIG. 11A is a cross-sectional view of the portion E taken along the line F-F' of FIG. 10. FIGS. 11B, 11C, and 12 are modifications of FIG. 10.

FIG. 9 illustrates a structure corresponding to the location of the portion D of the input-sensing layer TU, but also illustrates the display layer DU below the input-sensing layer TU in addition to the input-sensing layer TU.

Referring to FIG. 9, as described above, detection electrodes may be located in the display area DA. FIG. 9 illustrates some detection electrodes located at a right-lower corner of the display area DA, for example, the first detection electrode IE1-5 and the second detection electrode IE2-1.

Signal lines may be located outside the display area DA, namely, in the peripheral area NDA. FIG. 9 illustrates some signal lines located at the right-lower corner of the display area DA, for example, the first signal lines SL1-1 through SL1-5.

An electrostatic prevention line ESL may be located outside the first signal lines SL1-1 through SL1-5. The electrostatic prevention line ESL may be arranged outside the first signal lines SL1-1 through SL1-5 and the second signal lines SL2-1 through SL2-4, namely, on the outermost edge of the input-sensing layer TU. The electrostatic prevention line ESL may be included such that no signals are applied thereto, but instead a uniform constant voltage flows.

A shield layer 90 may be located outside the electrostatic prevention line ESL. The shield layer 90 may be arranged on the same layer as the pixel electrode 210 of FIG. 8A, and may include the same material as the material included in the pixel electrode 210. A driving circuit, for example, the second scan driving circuit 30, may be below the shield layer 90. The shield layer 90 may include a plurality of through holes 90H. The planarization layer 111 of FIG. 8A may be between the second scan driving circuit 30 and the shield layer 90, and outgas generated by the planarization layer 111 during the manufacture of the display apparatus may be exhausted via the plurality of through holes 90H.

An anti-reflection layer 92 may be arranged above the shield layer 90. In other embodiments, the planarization layer 111 located below the shield layer 90 may include a valley structure obtained by removing a portion of the planarization layer 111. The valley structure may block introduction of impurities into the display area DA by blocking external moisture permeation via the planarization layer 111 corresponding to an organic insulating material. The valley structure may also reduce or prevent overflow of the organic encapsulation layer 320 of FIG. 8A of the thin-film encapsulation layer TFE of FIG. 8A.

The anti-reflection layer 92 may overlap the valley structure, and may reflect external light to reduce or prevent visibility of the valley structure from the outside. For example, the anti-reflection layer 92 may include the same material as the material included in the detection electrodes of the input-sensing layer TU.

According to some embodiments, a crack-sensing line 80 may be outside the shield layer 90. According to some embodiments, when the display apparatus 1 includes a transmission unit that penetrates through the substrate 100 in the display area DA and/or the peripheral area NDA, the crack-sensing line 80 may sense a crack of the layers around the transmission unit. According to other embodiments, when the display apparatus 1 includes no transmission units, the crack-sensing line 80 may be omitted.

A first partition wall PW1 and a second partition wall PW2 may be located outside the crack-sensing line 80. A first valley portion VP1 and a second valley portion VP2 may be located outside the first partition wall PW1 and the second partition wall PW2. The first partition wall PW1, the second partition wall PW2, the first valley portion VP1, and the second valley portion VP2 will be described in detail with reference to FIG. 10 and other figures to be described later.

Referring to FIGS. 10 and 11A, the peripheral area NDA is on one side of (e.g., outside of) the display area DA. In the peripheral area NDA, an auxiliary partition wall PW0, the first partition wall PW1, and the second partition wall PW2 may be arranged in order adjacent to the display area DA. The auxiliary partition wall PW0, the first partition wall PW1, and the second partition wall PW2 may be spaced apart from one another (e.g., by a predetermined distance).

In FIG. 11A, the first partition wall PW1 and the second partition wall PW2 may include portions 111P1 and 111P2 of the planarization layer 111, portions 112P1 and 112P2 of the pixel-defining layer 112, and portions 113P1 and 113P2 of the spacer 113, respectively. However, the embodiments of the present disclosure are not limited thereto.

The auxiliary partition wall PW0 may be a single layer and may be located on the planarization layer 111. In this case, the auxiliary partition wall PW0 may include the same material as the pixel-defining layer 112 or the spacer 113. According to other embodiments, the auxiliary partition wall PW0 may be on the interlayer insulating layer 107. In this case, the auxiliary partition wall PW0 may include the same material as the planarization layer 111.

The first partition wall PW1 and the second partition wall PW2 are arranged to surround the display area DA, and may reduce or prevent overflow of the organic encapsulation layer 320 of the thin-film encapsulation layer TFE to the outside of the substrate 100. Accordingly, the organic encapsulation layer 320 may contact, or may be near, an inner surface of the first partition wall PW1 that faces the display area DA. In this case, the organic encapsulation layer 320 being near the inner surface of the first partition wall PW1 may be understood as the first inorganic encapsulation layer 310 being between the organic encapsulation layer 320 and the first partition wall PW1, the organic encapsulation layer 320 being in direct contact with the first inorganic encapsulation layer 310. The first inorganic encapsulation layer 310 and the second inorganic encapsulation layer 330 may be on the first and second partition walls PW1 and PW2 and may extend toward an edge of the substrate 100.

The valley portion VP may be located outside the second partition wall PW2. According to some embodiments, the valley portion VP may include the first valley portion VP1 and the second valley portion VP2. The first valley portion VP1 and the second valley portion VP2 may be formed by removing at least a portion of the first layer 410. The first valley portion VP1 and the second valley portion VP2 may be included by forming a hole (or a groove) that penetrates through at least a portion of the first layer 410, or may be included by forming a recess that does not completely penetrate through the first layer 410, but is formed in the first layer 410 in a direction toward the substrate 100. The first valley portion VP1 may be closer to the display area DA than the second valley portion VP2. The first valley portion VP1 and the second valley portion VP2 may control spreading of the second layer 420 having mobility upon film formation.

According to some embodiments, the first valley portion VP1 may include a plurality of first holes H1. In other words, it may be understood that the plurality of first holes H1 form at least one row and at least one column, and that this matrix of the plurality of first holes H1 forms the first valley portion VP1.

In FIG. 10, the second valley portion VP2 has an integrally connected shape in contrast with the first valley portion VP1. However, embodiments of the present disclosure are not limited thereto. Various embodiments regarding the shapes of the first valley portion VP1 and the second valley portion VP2 will be described in detail later with reference to FIGS. 14 through 21.

The second layer 420 may be included to cover the entirety of the display area DA, and may partially extend to the peripheral area NDA. The second layer 420 may extend to the second partition wall PW2 to cover the auxiliary partition wall PW0, the first partition wall PW1, and the second partition wall PW2, and might not overlap the first valley portion VP1. Accordingly, an end 420e of the second layer 420 may be spaced apart from the first valley portion VP1 (e.g., by a predetermined distance), and may be located between the second partition wall PW2 and the first valley portion VP1.

In FIG. 10 and its subsequent drawings, the end 420e of the second layer 420 is spaced apart from the first valley portion VP1 (e.g., by a predetermined distance). However, in some cases, at least a portion of the second layer 420 may fill at least some of the plurality of first holes H1 of the first valley portion VP1 and/or at least some of the second valley portion VP2. Even in this case, the second layer 420 may be controlled by the first valley portion VP1 (or the second valley portion VP2). This may mean that a portion of, or the entirety of, the second layer 420 may fill a portion of, or the entirety of, the first valley portion VP1 (or the second valley portion VP2), but, as a result, does not overflow (e.g., does not extend past) the first valley portion VP1 (or the second valley portion VP2).

An end TFEe of the thin-film encapsulation layer TFE may be between an end 100e of the substrate 100 and the end 410e of the first layer 410. The end TFEe of the thin-film encapsulation layer TFE may mean, or may correspond to, an end of the first inorganic encapsulation layer 310 and/or the second inorganic encapsulation layer 330.

Referring to FIG. 11A, the first valley portion VP1 and the second valley portion VP2 may penetrate through the first layer 410, and the first valley portion VP1 may include the plurality of first holes H1. The first valley portion VP1 and the second valley portion VP2 may expose at least a portion of the second inorganic encapsulation layer 330 located below the first layer 410.

A width W-VP1 of the first valley portion VP1 in one direction (e.g., the x direction) may be greater than a width W-VP2 of the second valley portion VP2 in the same direction (e.g., the x direction). The first valley portion VP1 may be a main valley portion for controlling spreading of the second layer 420, and the second valley portion VP2 may be an auxiliary valley portion prepared for a case when the second layer 420 spreads over the first valley portion VP1. Accordingly, due to the width W-VP1 of the first valley portion VP1 being greater than the width W-VP2 of the second valley portion VP2, a function as a main valley portion may be effectively achieved.

According to some embodiments, a depth dt of each of the plurality of first holes H1 may be, for example, about 2 μm or more (e.g., the first layer 410 may have a thickness of about 2 μm or more). However, when the thickness of the first layer 410 is less than or equal to about 2 μm, the depth dt of each of the plurality of first holes H1 may be adjusted by forming a hole or a recess in the first inorganic encapsulation layer 310 and/or the second inorganic encapsulation layer 330 located below the first layer 410. Substantially, for the first valley portion VP1 to control spreading of the second layer 420, each of the plurality of first holes H1 may have a depth (e.g., a predetermined depth, or a depth that is greater than the predetermined depth). When the depth dt of each of the plurality of first holes H1 is less than about 2 μm, it is difficult for the first valley portion VP1 to effectively control spreading of the second layer 420.

As shown in FIG. 11B, the anti-reflection layer PU may be arranged over the display panel DP of FIG. 11A. The anti-reflection layer PU may be attached to the display panel DP therebelow by the optically clear adhesion member OCA. The anti-reflection layer PU may be, for example, a polarizer, and may extend to the second valley portion VP2. As described above with reference to FIG. 10, an end PUe of the anti-reflection layer PU may overlap the second valley portion VP2. However, embodiments are not limited thereto, and, for example, the anti-reflection layer PU may overlap the display area DA while the end PUe of the anti-reflection layer PU does not extend to the second valley portion VP2. In this case, it is enough for the end PUe of the anti-reflection layer PU to be located at a boundary between the display area DA and the peripheral area NDA, or on the peripheral area NDA, and various modifications are possible. According to some embodiments, the end PUe of the anti-reflection layer PU may be between the display area DA and the second valley portion VP2.

According to other embodiments, as described above with reference to FIG. 8D, the color filter layer CU may be over the display panel DP of FIG. 11A. FIG. 11C may correspond to the peripheral area NDA extending from the display area DA of FIG. 8D. When the pixel-defining layer 112 and/or the spacer 113 are included as black matrices, as described above with reference to FIG. 8D, the auxiliary partition wall PW0, the first partition wall PW1, and the second partition wall PW2 arranged in the peripheral area NDA may be included as black matrices. In this case, a light-shielding material included in the pixel-defining layer 112 may flow to the lower planarization layer 111, and thus, at least a portion of the planarization layer 111 may become a black matrix, as shown in FIG. 11C.

As shown in FIG. 12, the display apparatus 1 according to some embodiments may include only the first valley portion VP1. In other words, as shown in FIG. 12, the second valley portion VP2 may be omitted, and spreading of the second layer 420 may be controlled by only the first valley portion VP1. The shape of the first valley portion VP1 in FIG. 12 is the same as the shape of the first valley portion VP1 described above with reference to FIG. 10. However, in FIG. 12, an arrangement of the plurality of first holes H1 may be changed.

Referring to FIGS. 11A through 12, the second layer 420 does not overlap the first valley portion VP1. A surface of the first layer 410 having the plurality of first holes H1 thereon has a hydrophobic property due to a low surface energy (surface tension). This phenomenon is referred to as a lotus effect. Because the surface of the first layer 410 has a hydrophobic property due to the lotus effect, the second layer 420 may be controlled to stop spreading in an area before reaching the first valley portion VP1, and without overflowing to the first valley portion VP1.

To increase or maximize the lotus effect, the sizes and a configuration of the plurality of first holes H1 constituting the first valley portion VP1 act as important factors. The size of each of the plurality of first holes H1 may suitably be a relatively minute size that is less than or equal to a given size (e.g., a predetermined size), and the plurality of first holes H1 may be arranged to have regularity. Various embodiments regarding the sizes and a configuration of the plurality of first holes H1 will now be described with reference to FIGS. 13 through 21.

Figure 13:
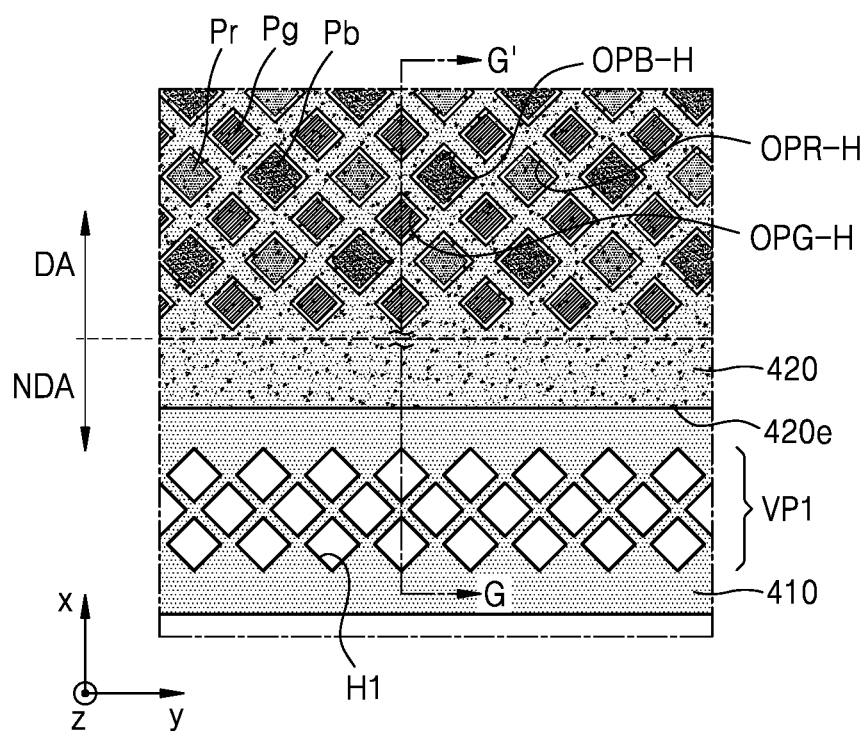
FIG. 13 is a magnified plan view of a portion of a display area and a first valley portion of FIG. 10.
Figure 14:
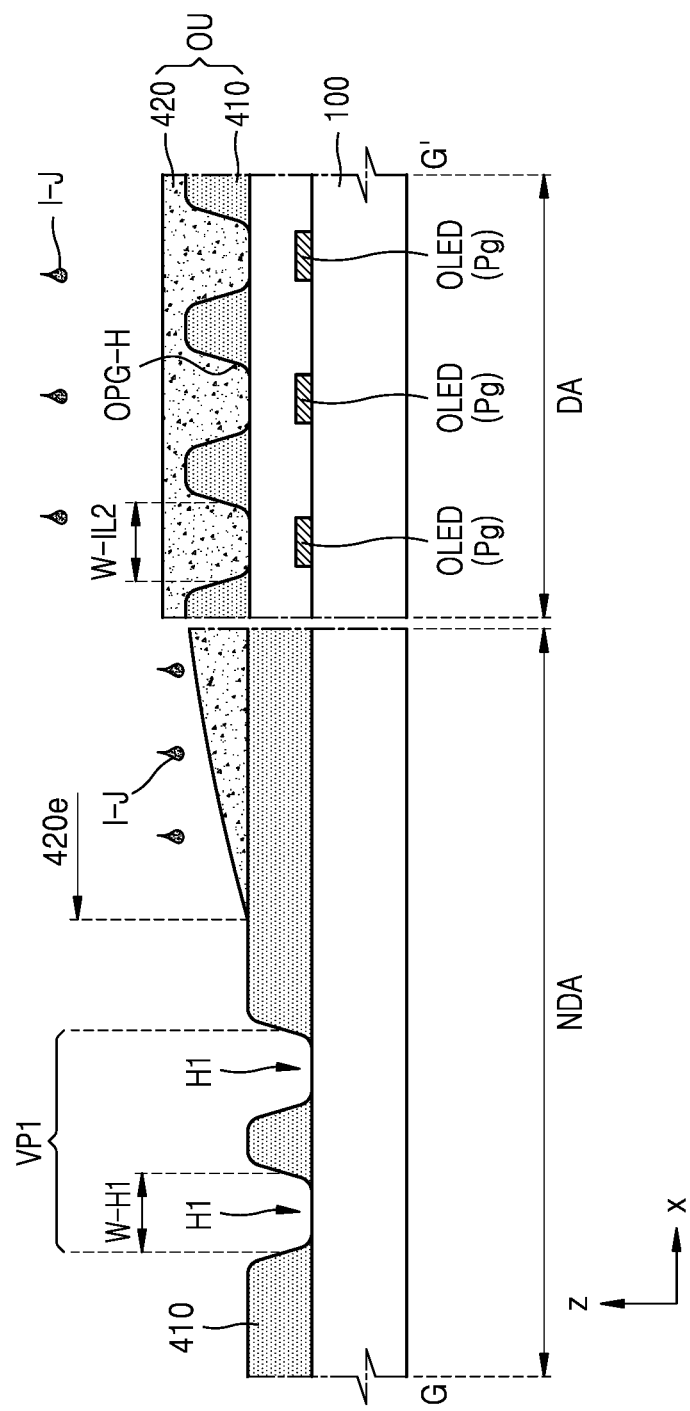
FIG. 14 is a cross-sectional view of a portion of a manufacturing process corresponding to a cross-section taken along the line G-G' of FIG. 13.
Figure 15:
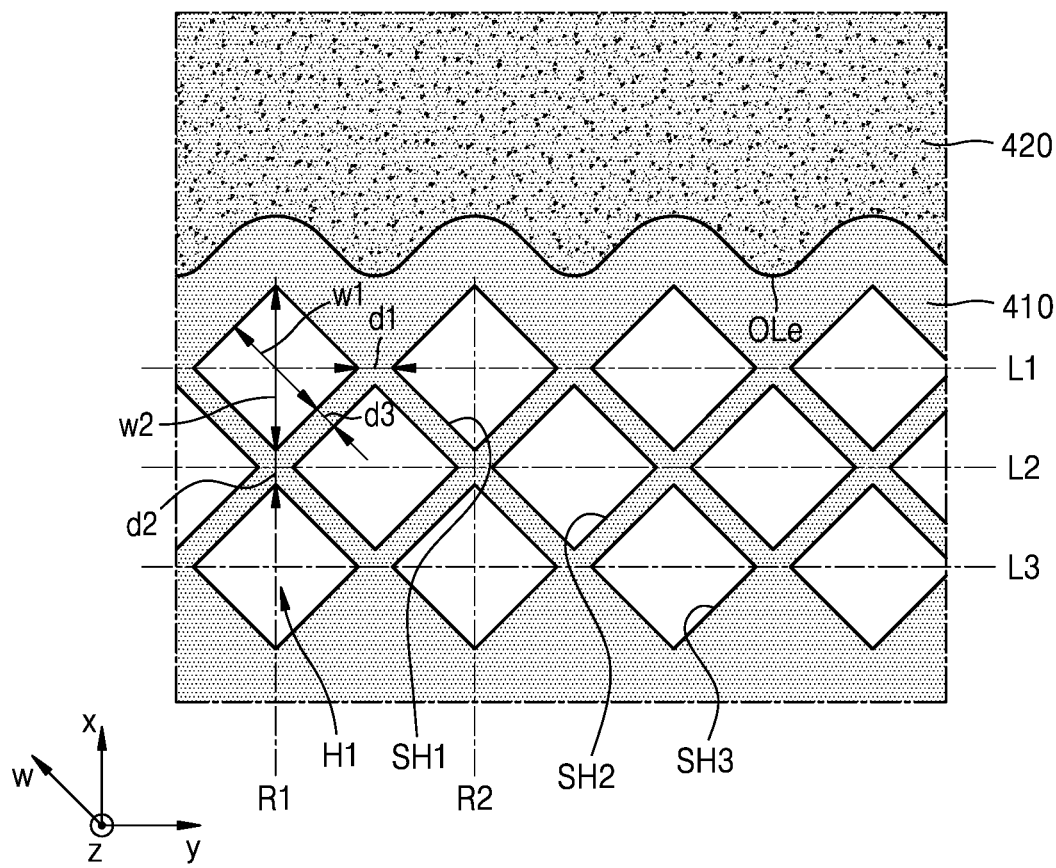
FIG. 15 is a magnified plan view of a portion of FIG. 13.

FIG. 13 is a magnified plan view of a portion of the display area and the first valley portion of FIG. 10, FIG. 14 is a cross-sectional view of a portion of a manufacturing process corresponding to a cross-section taken along the line G-G' of FIG. 13, and FIG. 15 is a magnified plan view of a portion of FIG. 13.

Referring to FIG. 13, the pixels Pr, Pg, and Pb may be arranged on the display area DA, and the first layer 410 may be arranged over the pixels Pr, Pg, and Pb. The first layer 410 may be arranged on the entire surface of the display area DA, and may extend to the peripheral area NDA.

The first layer 410 may include opening patterns OPR-H, OPG-H, and OPB-H in correspondence to the display area DA, and may include the first valley portion VP1 defined as the plurality of first holes H1 in correspondence to the peripheral area NDA. As described above, the opening patterns OPR-H, OPG-H, and OPB-H may correspond to the pixels Pr, Pg, and Pb, respectively.

In the display area DA, the second layer 420 may cover the first layer 410, and a portion of the second layer 420 may extend to the peripheral area NDA. The end 420e of the second layer 420 may be spaced apart from the first valley portion VP1 (e.g., by a predetermined distance). In other words, the second layer 420 might not overlap the first valley portion VP1.

The plurality of first holes H1 may be arranged to form at least one row in one direction (e.g., they direction), and at least one column in another direction (e.g., the x direction) that crosses the one direction (e.g., the y direction).

Referring to FIG. 15, the plurality of first holes H1 may include a plurality of first sub-holes SH1, a plurality of second sub-holes SH2, and a plurality of third sub-holes SH3 arranged in the one direction (e.g., they direction). The plurality of first sub-holes SH1, the plurality of second sub-holes SH2, and the plurality of third sub-holes SH3 may be arranged to form a first row L1, a second row L2, and a third row L3, respectively. The plurality of first sub-holes SH1 of the first row L1, the plurality of second sub-holes SH2 of the second row L2, and the plurality of third sub-holes SH3 of the third row L3 may be spaced apart from one another in the other direction (e.g., the x direction).

According to some embodiments, the plurality of first sub-holes SH1 may be spaced apart from one another at intervals of a first distance d1 in a first direction (e.g., the y direction), and the plurality of second sub-holes SH2 (e.g., respective top corners thereof) may be shifted from the plurality of first sub-holes SH1 (e.g., respective side corners thereof) by half of the first distance d1 in the first direction (e.g., the y direction). That is, the second sub-holes SH2 may be centered between respective adjacent ones of the first sub-holes SH1 with respect to the first direction while being offset from the first sub-holes SH1 in a second direction (e.g., the x direction). The plurality of second sub-holes SH2 may correspond to areas corresponding to the distances by which the plurality of first sub-holes SH1 are spaced apart from one another (e.g., the second sub-holes SH2 may be spaced apart from one another at intervals of the first distance d1 in the first direction). The plurality of third sub-holes SH3 may be arranged in the same manner as the plurality of first sub-holes SH1.

In other words, given that the first direction (e.g., the y direction) is a row direction and the second direction (e.g., the x direction) is a column direction, the plurality of first sub-holes SH1 and the plurality of third sub-holes SH3 are arranged in the same columns (for example, a first column R1 and a second column R2), but the plurality of second sub-holes SH2 may be located between the columns (for example, between the first column R1 and the second column R2). As the plurality of second sub-holes SH2 is located by being shifted by ½ of the first distance d1 between the plurality of first sub-holes SH1 as described above, a control area of the second layer 420, which spreads with mobility toward the plurality of first sub-holes SH1, may increase, and thus spreading of the second layer 420 may be more effectively controlled.

The second layer 420 may spread in a direction toward the first valley portion VP1 (e.g., a −x direction), may be primarily controlled by the plurality of first sub-holes SH1, and may be secondarily controlled by the plurality of second sub-holes SH2. According to some embodiments, the end 420e of the second layer 420 may be curved in accordance with the shape in which the plurality of first sub-holes SH1 and the plurality of second sub-holes SH2 are arranged as in FIG. 15.

Each of the plurality of first holes H1 may have any of various shapes. Each of the plurality of first holes H1 may have various shapes, for example, a circle, an oval, a polygon, and a corner-rounded polygon. According to some embodiments, each of the plurality of first holes H1 may have a diamond shape. In other words, the plurality of first holes H1 may have a rectangular shape, but also may have a diamond shape. The diamond shape refers to at least one vertex of each of the plurality of first holes H1 facing the end 420e of the second layer 420. Accordingly, because portions of the plurality of first holes H1 corresponding to vertexes (instead of edges corresponding to sides) are arranged to face the end 420e of the second layer 420, a pressure at the end 420e of the second layer 420 may be dispersed, and thus spreading of the second layer 420 may be more effectively controlled.

When the size of each of the plurality of first holes H1 increases (e.g., to a predetermined size or greater), the lotus effect may degrade, and thus spreading of the second layer 420 may be less effectively controlled and may overflow to the first valley portion VP1.

Thus, according to some embodiments, given that each of the plurality of first holes H1 has a diamond shape, two sides facing each other may have a first width w1 therebetween. For example, the first width w1 may be about 1 μm to about 10 μm. In each of the plurality of first holes H1, a second width w2 between two vertexes facing each other may be about 1 μm to about 15 μm. For example, if the first width w1 is about 10 μm, the second width w2 may be about 14.14 μm.

When a distance between the plurality of first holes H1 is widened (e.g., to a predetermined distance or greater) the lotus effect may degrade.

Thus, according to some embodiments, the plurality of first holes H1 may be spaced apart from one another at intervals of the first distance d1 in the first direction (e.g., the y direction). For example, the first distance d1 may be about 1 μm to about 15 μm. According to some embodiments, the first width w1 of each of the plurality of first holes H1 may be less than the first distance d1 between the plurality of first holes H1.

The plurality of first holes H1 may be spaced apart from one another by a second distance d2 in a second direction (e.g., the x direction). In detail, a first sub-hole SH1 and a third sub-hole SH3 aligned in the first row R1 may be spaced apart from each other by the second distance d2. For example, the second distance d2 may be about 1 μm to about 15 μm.

The plurality of first holes H1 may be spaced apart from one another by a third distance d3 in a third direction (e.g., a w direction). The third direction (e.g., the w direction) may cross the first direction (e.g., the y direction) and the second direction (e.g., the x direction) at the same time, and may be, for example, a diagonal direction. For example, the third distance d3 may be about 1 μm to about 10 μm.

FIG. 14 illustrates both the display area DA and the peripheral area NDA with reference to FIG. 12. To focus on and describe the opening patterns OPG-H and the plurality of first holes H1 formed in the first layer 410 and the second layer 420 arranged on the first layer 410, FIG. 14 omits illustrating the other components.

To correspond to the display area DA, a display element, namely, an organic light-emitting diode OLED, is arranged on the substrate 100. Organic light-emitting diodes OLED each including a pixel Pg that emits green light are illustrated. The first layer 410 is over the organic light-emitting diodes OLED, and the first layer 410 may include opening patterns OPG-H in correspondence to the organic light-emitting diodes OLED, respectively.

The first layer 410 may extend to the peripheral area NDA, and may include the first valley portion VP1 having the plurality of first holes H1 in the peripheral area NDA.

According to some embodiments, a width W-H1 of each of the plurality of first holes H1 may be less than or equal to a width W-IL2 of each of the opening patterns OPG-H. Referring to FIG. 7 or 13 described above, the pixels Pr, Pg, and Pb may include first pixels Pr emitting red light, second pixels Pg emitting green light, and third pixels Pb emitting blue light. The area of each second pixel Pg emitting green light may be less than that of each first pixel Pr or each third pixel Pb. Accordingly, the opening patterns OPR-H, OPG-H, and OPB-H have sizes to correspond to the sizes of the pixels Pr, Pg, and Pb, respectively, and the opening pattern OPG-H corresponding to the second pixel Pg emitting green light may have the smallest size. The width W-H1 of each of the plurality of first holes H1 may be less than or equal to the width W-IL2 of the opening pattern OPG-H corresponding to the second pixel Pg from among the opening patterns OPR-H, OPG-H, and OPB-H.

The second layer 420 may be on the first layer 410, and may be formed using the inkjet method as in FIG. 14. In other words, the second layer 420 may be formed by depositing an ink jet material I-J directly onto the first layer 410. In the display apparatus 1 according to some embodiments, the first valley portion VP1 controls spreading of the second layer 420, thereby reducing or preventing overflow of the second layer 420 to the edge of the substrate 100, and thus a defect rate when an inkjet process is used may be reduced or minimized.

FIGS. 16 through 21 are plan views schematically illustrating a portion of a display apparatus according to some embodiments. FIGS. 16 through 21 illustrate modifications of the example shown in FIG. 13.

Figure 16:
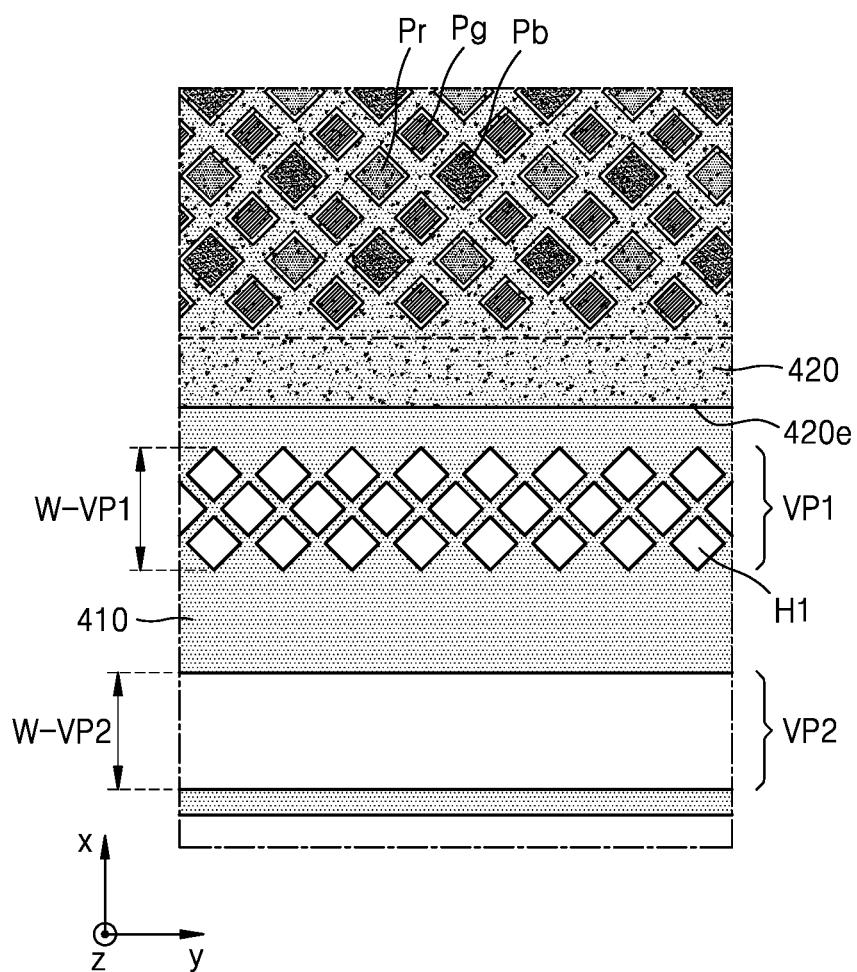
FIGS. 16 through 21 are plan views schematically illustrating a portion of a display apparatus according to some embodiments.

Referring to FIG. 16, the first layer 410 may further include the second valley portion VP2 outside the first valley portion VP1. FIG. 16 may correspond to FIGS. 10 and 11A. The structure of FIG. 16 is the same as that of FIGS. 10 and 11A, and thus a redundant description thereof will be omitted.

Figure 17:
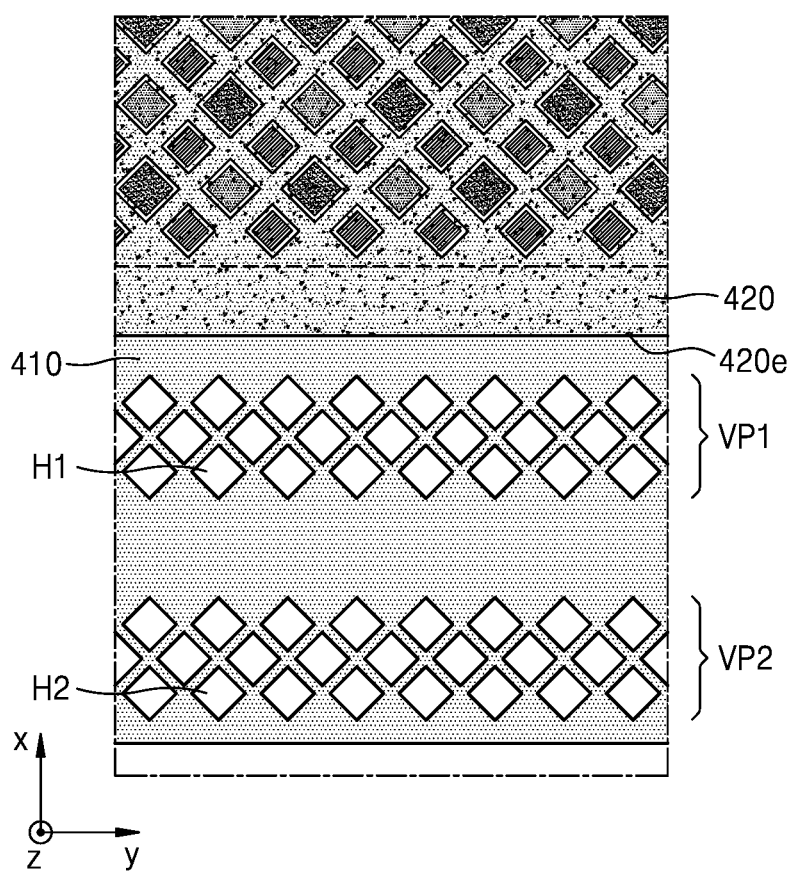

FIG. 17 is similar to FIG. 16, but is different therefrom in that the second valley portion VP2 includes the plurality of second holes H2 in the same manner as the first valley portion VP1. A configuration of, and respective shapes of, the plurality of second holes H2 constituting the second valley portion VP2 may be the same as those of the first valley portion VP1, and thus a redundant description thereof will be omitted.

Figure 18:
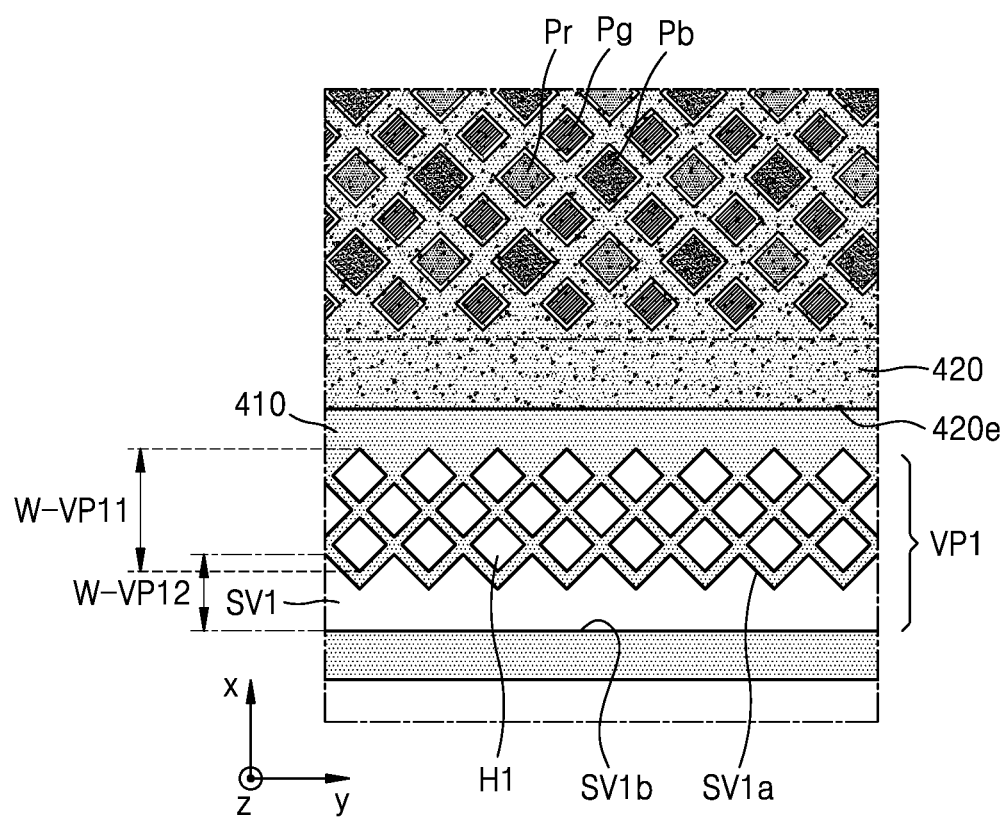

Referring to FIG. 18, the first layer 410 includes the first valley portion VP1, and the first valley portion VP1 may include the plurality of first holes H1 and a first auxiliary valley SV1. The first auxiliary valley SV1 may be continuously formed along a first direction (e.g., they direction) that is substantially parallel to the end 420e of the second layer 420, with the plurality of first holes H1 being between the first auxiliary valley SV1 and the end 420e of the second layer 420.

A width W-VP11 of a plurality of first holes H1 in a second direction (e.g., the x direction) may be equal to or greater than a width (e.g., average width, maximum width, or minimum width) W-VP12 of the first auxiliary valley SV1 in the second direction (e.g., the x direction). Because the first auxiliary valley SV1 substantially plays an auxiliary role in controlling spreading of the second layer 420, the plurality of first holes H1 playing a main role, or lead role, of controlling spreading of the second layer 420 may have a wider area than the first auxiliary valley SV1.

In the first auxiliary valley SV1, a first end SV1a thereof, which is adjacent to the plurality of first holes H1, may be curved, or may have a sawtooth shape, along the configuration of the plurality of first holes H1. FIG. 17 illustrates the first end SV1a having an irregular shape in accordance with the shape of the plurality of first holes H1, but embodiments are not limited thereto.

A second end SV1b of the first auxiliary valley SV1, which is opposite to the first end SV1a, may be included as a straight line. Because the first end SV1a is in a direction toward the second layer 420, if the second layer 420 overflows to the plurality of first holes H1, the shape of the first end SV1a of the first auxiliary valley SV1 may distribute the pressure of the end 420e of the second layer 420.

Figure 19:
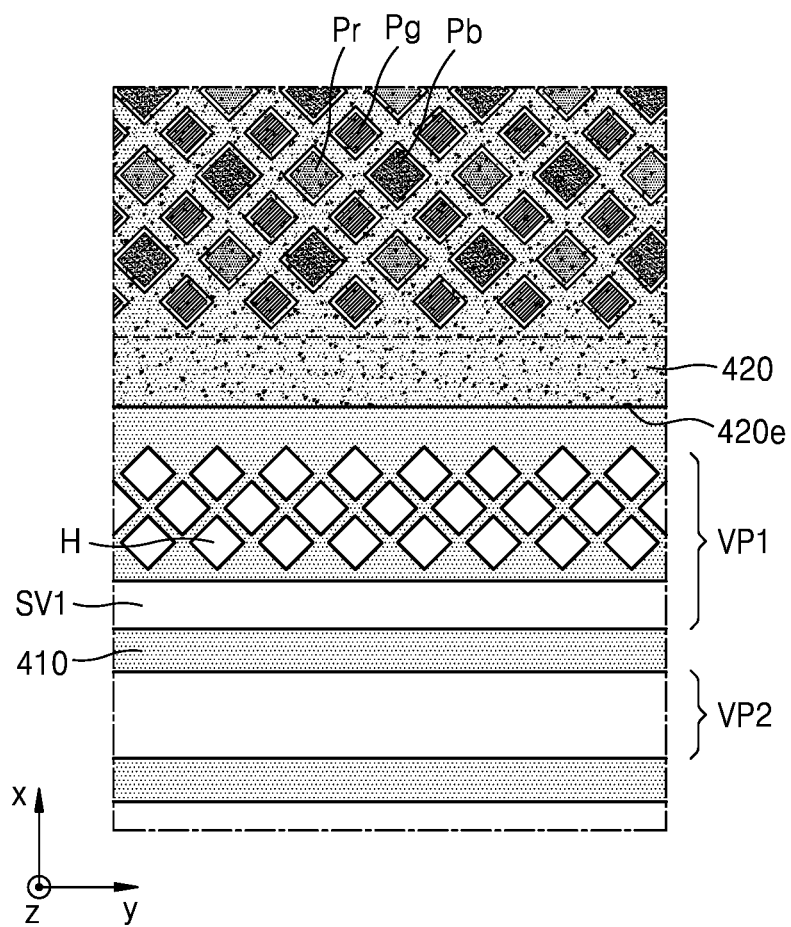

According to other embodiments, as in FIG. 19, both the first end SV1a and the second end SV1b of the first auxiliary valley SV1 may be included as straight lines.

Figure 20:
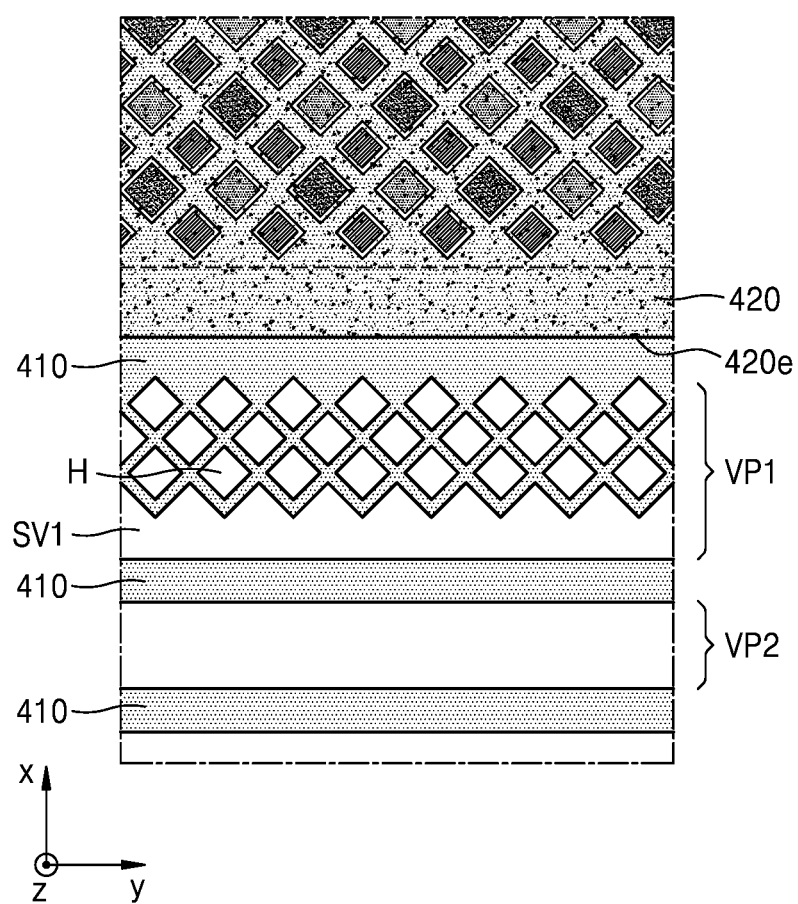
Figure 21:
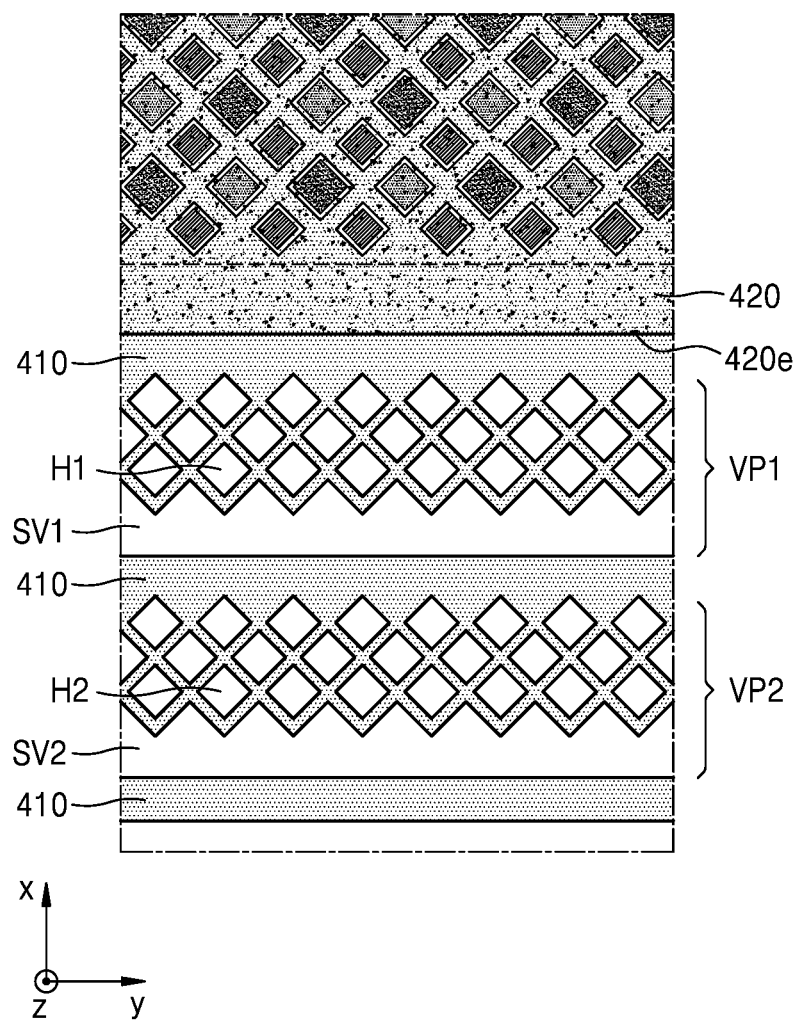

FIGS. 19 and 20 are similar to FIG. 18, but are different therefrom in that the second valley portion VP2 is further included outside the first valley portion VP1. A configuration and a shape of the second valley portion VP2 are the same as the above-described configuration, and the above-described shape of the second valley portion VP2, and thus a redundant description thereof will be omitted.

FIG. 20 is similar to FIG. 18, but is different therefrom in that a second valley portion VP2 having the same shape as the first valley portion VP1 is further included. A configuration and a shape of the second valley portion VP2 are the same as the above-described configuration, and the above-described shape of the second valley portion VP2, and thus a redundant description thereof will be omitted.

Although only a display apparatus has been described above, embodiments are not limited thereto. For example, a method of manufacturing a display apparatus by using such a display apparatus also belongs to the scope of the disclosure.

According to some embodiments as described above, a display apparatus having an improved reliability by effectively controlling spreading of an organic layer may be realized. Of course, the scope of the disclosure is not limited thereto.

It should be understood that embodiments described herein should be considered in a descriptive sense only and not for purposes of limitation. Descriptions of aspects of the disclosed embodiments should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalent thereof to be include therein.

What is claimed is:

1. A display apparatus comprising:
a substrate comprising a display area, and a peripheral area outside the display area;
a display element at the display area;
an input-sensing layer over the display element; and
an optical functional layer on the input-sensing layer, and comprising a first layer, which corresponds to the display area and the peripheral area, and a second layer on the first layer, and having a greater refractive index than the first layer,
wherein the first layer defines a first valley portion defining first holes that is in the peripheral area, and that surrounds the second layer.

2. The display apparatus of claim 1, wherein the first holes are aligned in at least one row in a first direction, and in at least one column in a second direction that crosses the first direction.

3. The display apparatus of claim 2, wherein the first holes comprise:
first sub-holes arranged in the first direction;
second sub-holes spaced from the first sub-holes, and arranged in the first direction; and
third sub-holes spaced from the second sub-holes, and arranged in the first direction.

4. The display apparatus of claim 3, wherein the first sub-holes are spaced from each other at intervals of a first distance, and
wherein the second sub-holes are centered between respective adjacent ones of the first sub-holes with respect to the first direction.

5. The display apparatus of claim 1, wherein at least one of the first holes has a diamond shape.

6. The display apparatus of claim 5, wherein at least one vertex of the first holes faces an end of the second layer.

7. The display apparatus of claim 5, wherein a first width between two parallel sides of one of the first holes is about 1 μm to about 10 μm.

8. The display apparatus of claim 7, wherein a second width between two opposite vertexes of one of the first holes is about 1 μm to about 15 μm.

9. The display apparatus of claim 8, wherein an adjacent pair of the first holes are spaced from each other in a first direction at intervals of a first distance of about 1 μm to about 15 μm.

10. The display apparatus of claim 9, wherein the first width is less than the first distance.

11. The display apparatus of claim 1, wherein the first valley portion further comprises an auxiliary valley extending in a first direction, the first holes being between the auxiliary valley and an end of the second layer.

12. The display apparatus of claim 11, wherein a first end of the auxiliary valley that is adjacent to the first holes is curved in correspondence with a shape and arrangement of the first holes.

13. The display apparatus of claim 12, wherein a second end of the auxiliary valley that is opposite to the first end comprises a straight shape.

14. The display apparatus of claim 1, wherein the first layer further defines a second valley portion that surrounds the second layer in correspondence with the peripheral area, and that is spaced from the first valley portion.

15. The display apparatus of claim 14, wherein the second valley portion defines second holes.

16. The display apparatus of claim 14, wherein the second valley portion extends in a first direction.

17. The display apparatus of claim 16, wherein a width of the second valley portion in a second direction that crosses the first direction is less than or equal to a width of the first valley portion.

18. The display apparatus of claim 1, further comprising a thin-film encapsulation layer that is between the display element and the input-sensing layer, and that comprises at least one organic encapsulation layer and at least one inorganic encapsulation layer,
wherein the input-sensing layer is directly on the thin-film encapsulation layer.

19. The display apparatus of claim 18, further comprising a partition wall surrounding the display area in correspondence with the peripheral area,
wherein the first valley portion surrounds the partition wall.

20. The display apparatus of claim 19, wherein the second layer covers the partition wall.

21. The display apparatus of claim 18, wherein the at least one inorganic encapsulation layer extends below the first layer in the peripheral area, and
wherein the first holes expose at least a portion of the at least one inorganic encapsulation layer.

22. The display apparatus of claim 1, wherein the first layer further defines an opening pattern corresponding to the display element.

23. The display apparatus of claim 22, wherein a width of at least one of the first holes is less than or equal to a width of the opening pattern.

24. The display apparatus of claim 22, wherein the display element comprises a pixel electrode, an opposite electrode opposite the pixel electrode, and an intermediate layer between the pixel electrode and the opposite electrode,
wherein the display apparatus further comprises a pixel-defining layer covering an edge of the pixel electrode, and having an opening that exposes a center portion of the pixel electrode, and
wherein a width of the opening pattern is less than a width of the opening.

25. The display apparatus of claim 24, wherein the intermediate layer comprises a green emission layer, and
wherein the opening pattern has a same size as a corresponding one of the first holes.

26. The display apparatus of claim 1, wherein the second layer has a greater refractive index than the first layer.

27. The display apparatus of claim 26, wherein the second layer has a refractive index of about 1.6 or greater.

28. The display apparatus of claim 1, wherein a depth of the first holes is about 2 μm or greater.

29. The display apparatus of claim 1, wherein the second layer extends toward the peripheral area, and comprises an end spaced from the first valley portion.

30. A display apparatus comprising:
a substrate comprising a display area, and a peripheral area outside the display area;
an organic insulating layer on the substrate; and
a high refractive index layer on the organic insulating layer in correspondence with the display area,
wherein the organic insulating layer defines a first valley portion that surrounds the high refractive index layer in correspondence with the peripheral area, and that defines holes, and wherein the high refractive index layer extends toward the peripheral area, and is spaced from the first valley portion.

* * * * *